United States Patent
Edo et al.

(10) Patent No.: US 7,522,146 B2
(45) Date of Patent: Apr. 21, 2009

(54) SCANNING-LINE SELECTING CIRCUIT AND DISPLAY DEVICE USING THE SAME

(75) Inventors: Susumu Edo, Mito (JP); Shinichi Komura, Hitachi (JP); Shoichi Hirota, Hitachi (JP); Nobuyuki Ishige, Shirako (JP)

(73) Assignee: Hitachi Displays, Ltd., Mobara-shi (JP)

( * ) Notice: Subject to any disclaimer, the term of this patent is extended or adjusted under 35 U.S.C. 154(b) by 781 days.

(21) Appl. No.: 11/002,212

(22) Filed: Dec. 3, 2004

(65) Prior Publication Data

US 2005/0174315 A1 Aug. 11, 2005

(30) Foreign Application Priority Data

Dec. 5, 2003 (JP) ............................ 2003-406689
Oct. 27, 2004 (JP) ............................ 2004-312430

(51) Int. Cl.
    G09G 3/36 (2006.01)
(52) U.S. Cl. ............................ 345/100; 345/87; 345/92
(58) Field of Classification Search ................. 345/100, 345/87, 92
    See application file for complete search history.

(56) References Cited

U.S. PATENT DOCUMENTS

| | | | | |
|---|---|---|---|---|
| 5,495,265 A | * | 2/1996 | Hartman et al. | 345/87 |
| 5,844,534 A | * | 12/1998 | Okumura et al. | 345/90 |
| 6,806,495 B1 | * | 10/2004 | Yamazaki et al. | 257/59 |
| 7,079,123 B2 | * | 7/2006 | Shino et al. | 345/204 |
| 7,133,034 B2 | * | 11/2006 | Park et al. | 345/204 |
| 7,187,392 B2 | * | 3/2007 | Ito | 345/690 |
| 7,355,575 B1 | * | 4/2008 | Ota et al. | 345/87 |
| 2004/0041778 A1 | * | 3/2004 | Hiraki et al. | 345/100 |
| 2004/0108518 A1 | * | 6/2004 | Jo | 257/200 |

FOREIGN PATENT DOCUMENTS

JP  A-2002-311879  10/2002

* cited by examiner

*Primary Examiner*—Bipin Shalwala
*Assistant Examiner*—Afroza Y Chowdhury
(74) *Attorney, Agent, or Firm*—Antonelli, Terry, Stout & Kraus, LLP.

(57) ABSTRACT

A scanning-line selecting circuit is configured by connecting basic circuits with each other over plural stages. Each of the basic circuits includes a basic scanning-line driving circuit and a voltage raising circuit. A basic scanning signal is inputted into the basic scanning-line driving circuit, which, then, outputs a scanning signal. A charge pulse, a selecting signal, and a discharge pulse are inputted into the voltage raising circuit, which, then, drives the basic scanning-line driving circuit. Accordingly, in the basic circuits, there exists none of the problems of threshold-value shift and voltage lowering. This characteristic makes it possible to implement high efficiency and stable operation.

2 Claims, 18 Drawing Sheets

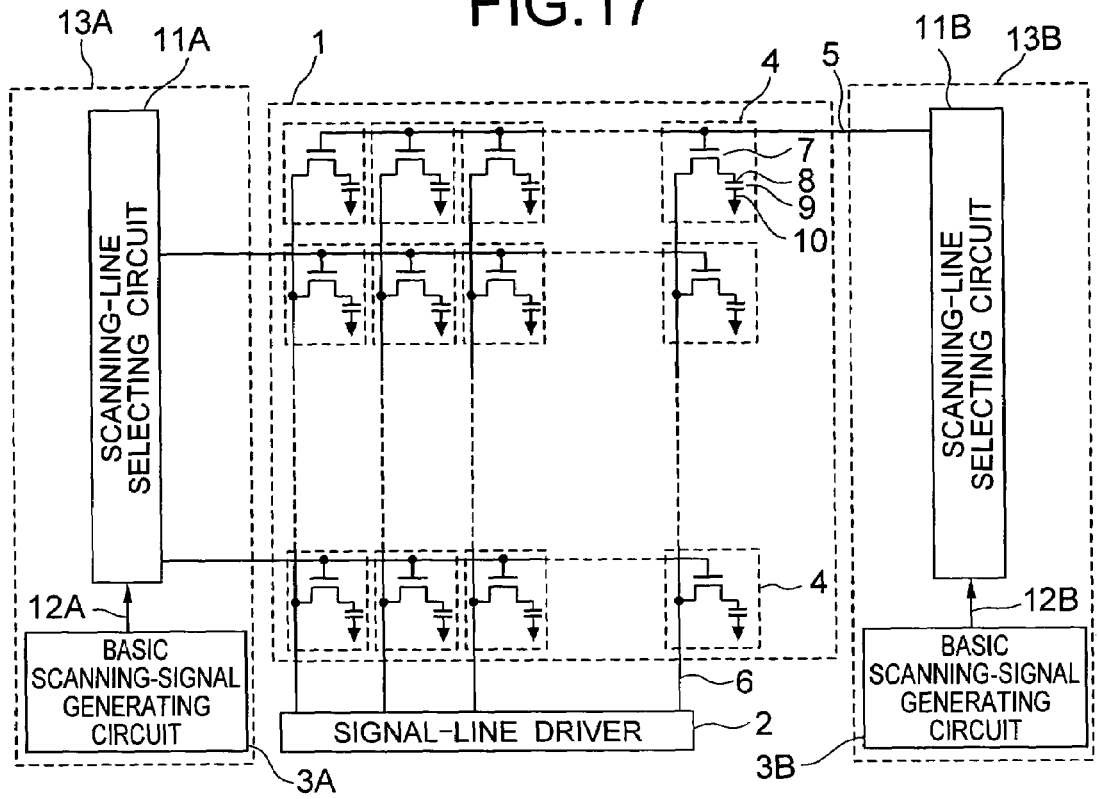
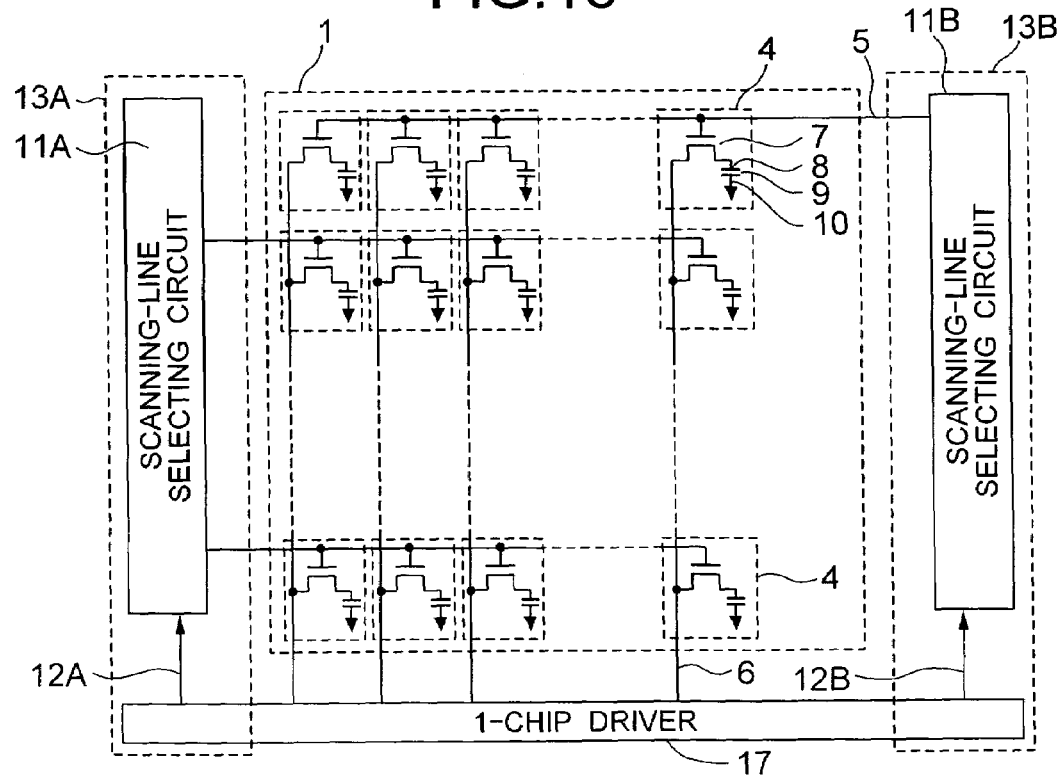

SCANNING-LINE SELECTING CIRCUIT AND DISPLAY DEVICE USING THE SAME

BACKGROUND OF THE INVENTION

1. Field of the Invention

The present invention relates to a scanning-line selecting circuit and a display device using the same. In particular, it relates to a liquid crystal display, or a TFT (Thin Film Transistor) active-matrix liquid crystal display.

2. Description of the Related Art

From conventionally, a proposal has been made concerning a method for driving all of scanning lines by reducing output number of scanning-line driving IC down to one-several tenths, and also by using a scanning-line selecting circuit. Here, this proposal has been made in order to allow a decrease in implementation cost and driving IC cost, an enhancement in reliability, and a reduction in area of non-display portion.

Also, in an a-Si (i.e., amorphous-silicon) TFT, there exists a problem of "threshold-value shift" which is characteristic of the a-Si TFT. Namely, if a voltage higher or lower than a first terminal (drain or source) and a second terminal (source or drain) continues to be applied to a gate terminal (this state is referred to as "DC stress"), the threshold value of the a-Si TFT also shifts to a higher or lower value. There has been such a problem called "threshold-shift." Accordingly, it is necessary to avoid this problem. Also, it has been found that basically the same problem exists not only in the a-Si TFT also but also in an organic TFT.

In order to avoid this problem of the threshold-value shift in the scanning-line selecting circuit, it is required to configure the circuit such that the DC stress will be suppressed down to the smallest possible degree. Its concrete embodiment has been disclosed in, e.g., JP-A-2002-311879 and the like.

SUMMARY OF THE INVENTION

In such a circuit, even if the voltage applied to the gate electrode of the switching element (i.e., TFT) and the one applied to the drain electrode thereof are equal with each other, the following stabilization processing is desirable: Namely, the voltage outputted from the source electrode of the switching element and applied to the scanning lines should be stabilized so that the voltage will not decrease by the amount of the threshold-value voltage of the switching element as compared with the input voltage.

Also, this means that a variation in the output voltage can be suppressed within a small range when the threshold-value voltage of the switching element varies depending on such factors as a time-lapse factor and a temperature condition.

It is an object of the present invention to provide a scanning-line selecting circuit and a display device using the same, which are excellent in economy and stability, and which allow the output to be stably maintained independently of such factors as a time-lapse factor and a temperature condition even if input voltage of the scanning-line selecting circuit and voltage amplitude of a scanning-line driving signal are made equal with each other.

In order to accomplish the above-described object, in the scanning-line selecting circuit according to the present invention, the scanning-line selecting circuit includes basic circuits which are connected with each other over plural stages. Here, each basic circuit includes a basic scanning-signal input terminal, a selecting-signal input terminal, a charge-pulse input terminal, a discharge-pulse input terminal, and an output terminal, and also a basic scanning-line driving circuit and a voltage raising circuit.

The scanning-line driving circuit includes a scanning-line driving element. The voltage raising circuit includes a charge element, a voltage-raising capacitor, and a discharge element.

A first terminal of the charge element, a gate terminal thereof, and a second terminal thereof are connected to the selecting-signal input terminal, the charge-pulse input terminal, and a gate terminal of the scanning-line driving element, a first terminal of the voltage-raising capacitor, and a first terminal of the discharge element, respectively. Also, a first terminal of the scanning-line driving element is connected to the basic scanning-signal input terminal. A second terminal of the scanning-line driving element is connected to a second terminal of the voltage-raising capacitor and a second terminal of the discharge element, and also configures the output terminal. A gate terminal of the discharge element is connected to the discharge-pulse input terminal.

Also, the voltage raising circuit includes a charge element, a voltage-raising capacitor, and a discharge element. The scanning-line driving circuit includes a scanning-line driving element and a scanning-line stabilizing element.

A first terminal of the charge element, a gate terminal thereof, and a second terminal thereof are connected to the selecting-signal input terminal, the charge-pulse input terminal, and a gate terminal of the scanning-line driving element, a first terminal of the voltage-raising capacitor, and a first terminal of the discharge element, respectively. Also, a first terminal of the scanning-line driving element is connected to the basic scanning-signal input terminal and a first terminal of the scanning-line stabilizing element. A second terminal of the scanning-line driving element is connected to a second terminal of the voltage-raising capacitor, a second terminal of the discharge element, and a gate terminal and a second terminal of the scanning-line stabilizing element, and also configures the output terminal. A gate terminal of the discharge element is connected to the discharge-pulse input terminal.

Moreover, a first terminal of the charge element, a gate terminal thereof, and a second terminal thereof are connected to the selecting-signal input terminal, the charge-pulse input terminal, and a gate terminal of the scanning-line driving element, a first terminal of the voltage-raising capacitor, and a first terminal of the discharge element, respectively. Also, a first terminal of the scanning-line driving element is connected to the basic scanning-signal input terminal, a second terminal of the discharge element, and a first terminal of the scanning-line stabilizing element. A second terminal of the scanning-line driving element is connected to a second terminal of the voltage-raising capacitor, and a gate terminal and a second terminal of the scanning-line stabilizing element, and also configures the output terminal. A gate terminal of the discharge element is connected to the discharge-pulse input terminal.

Also, the scanning-line selecting circuit includes a stabilizing capacitor. A first terminal of the stabilizing capacitor and a second terminal thereof are connected to the gate terminal of the charge element and the gate terminal of the scanning-line driving element, respectively.

Further, in the scanning-line selecting circuit, assuming that the number of basic scanning signals to be inputted is equal to I, and that a basic scanning signal connected to the basic scanning-signal input terminal of each basic circuit is an i-th basic scanning signal, the charge-pulse input terminal is connected to an (i−1)-th basic scanning signal (however, an I-th basic scanning signal in the case of i=1), and the discharge-pulse input terminal is connected to an (i+1)-th basic scanning signal (however, a 1st basic scanning signal in the case of i=I).

Also, in the scanning-line selecting circuit, assuming that output number of the scanning-line selecting circuit is equal to N, and that the number of basic scanning signals to be inputted is equal to I, and that a basic scanning signal connected to the basic scanning-signal input terminal of each basic circuit is an i-th basic scanning signal, the charge-pulse input terminal is connected to an (i−1)-th basic scanning signal (however, an I-th basic scanning signal in the case of i=1), and the discharge-pulse input terminal is connected to an (i+1)-th basic scanning signal (however, a 1st basic scanning signal in the case of i=I). Also, a charge-pulse input terminal of a voltage raising circuit belonging to a 1st basic circuit is connected to an auxiliary signal provided in a separate way, and a discharge-pulse input terminal of a voltage raising circuit belonging to an N-th basic circuit is connected to another auxiliary signal.

Still further, in the scanning-line selecting circuit, assuming that the number of basic scanning signals to be inputted is equal to I, and that a basic scanning signal connected to the basic scanning-signal input terminal of each basic circuit is an i-th basic scanning signal, the charge-pulse input terminal is connected to an (i−1)-th basic scanning signal (however, an I-th basic scanning signal in the case of i=1), and the discharge-pulse input terminal is connected to an (i+2)-th basic scanning signal (however, a 1st basic scanning signal in the case of i=I−1, and a 2nd basic scanning signal in the case of i=I).

Also, in the scanning-line selecting circuit, assuming that output number of the scanning-line selecting circuit is equal to N, and that the number of basic scanning signals to be inputted is equal to I, and that a basic scanning signal connected to a basic circuit to which a voltage raising circuit belongs is an i-th basic scanning signal, the charge-pulse input terminal is connected to an (i−1)-th basic scanning signal (however, an I-th basic scanning signal in the case of i=1), and the discharge-pulse input terminal is connected to an (i+2)-th basic scanning signal (however, a 1st basic scanning signal in the case of i=I−1, and a 2nd basic scanning signal in the case of i=I). Also, a charge-pulse input terminal of a 1st basic circuit is connected to an auxiliary signal provided in a separate way, and a discharge-pulse input terminal of an (N−1)-th basic circuit is connected to another auxiliary signal, and a discharge-pulse input terminal of an N-th basic circuit is connected to still another auxiliary signal.

Furthermore, in the display device where pixel components located in a matrix-like configuration are driven, the scanning-line selecting circuit or circuits is or are provided on one side or both sides thereof.

The scanning-line selecting circuit according to the present invention and the display device using the same result in none of the problems of the threshold-value shift and voltage lowering. This characteristic makes it possible to implement high efficiency and stable operation.

BRIEF DESCRIPTION OF THE DRAWINGS

FIG. 17 is a schematic diagram for illustrating the entire configuration of another embodiment of the display device according to the present invention;

FIG. 18 is a schematic diagram for illustrating the entire configuration of another embodiment of the display device according to the present invention;

DETAILED DESCRIPTION OF THE INVENTION

Figure 1:
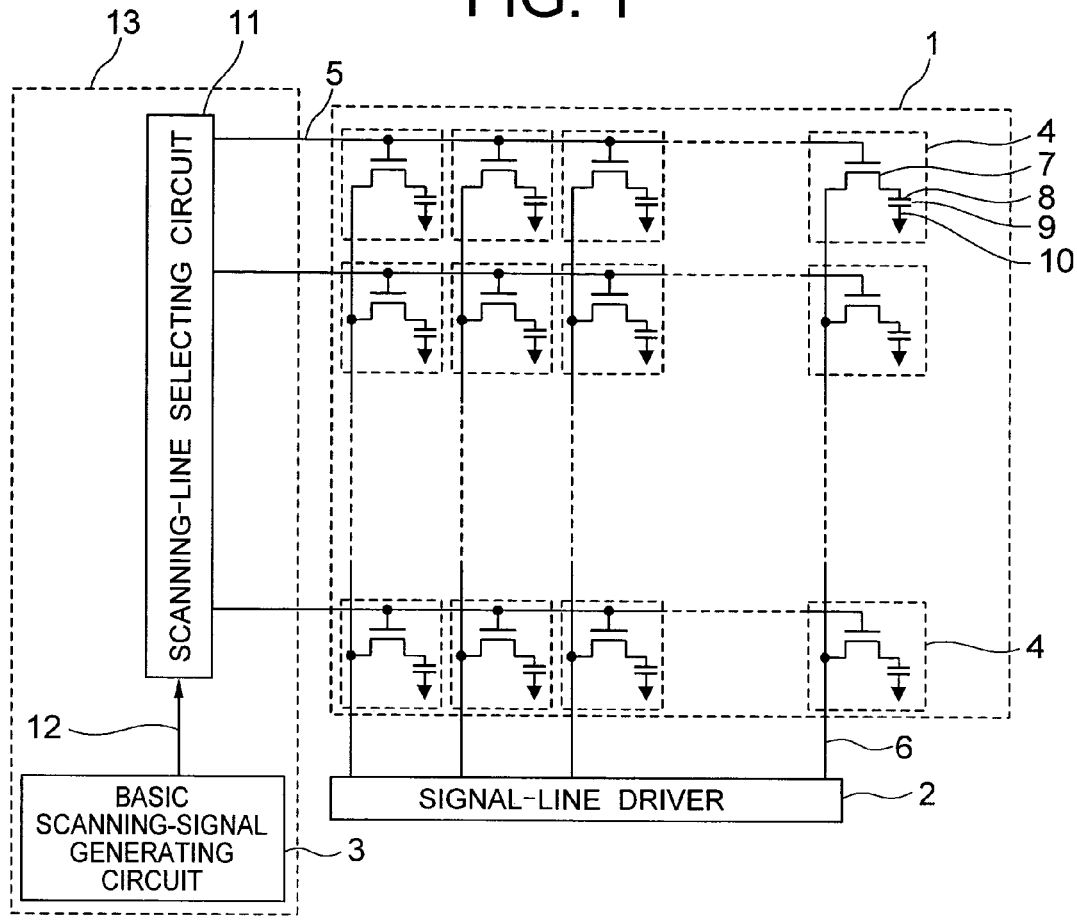
FIG. 1 is a schematic diagram for illustrating the entire configuration of an embodiment of a display device according to the present invention.

Hereinafter, referring to the drawings, the explanation will be given below concerning embodiments of the present invention.

EMBODIMENT 1

FIG. 1 is a schematic diagram for illustrating the entire configuration of a display device according to the present invention. This display device includes a display unit 1, a signal-line driver 2, and a scanning-line driving circuit 13. Pixel components 4 are located in a matrix-like configuration on the display unit 1 formed on a glass substrate.

Each pixel portion 4 has a structure that a thin film transistor (hereinafter, referred to as "TFT") 7 exists at an intersection point of a signal line 6 and a scanning line 5. A gate terminal of the TFT 7, a first terminal thereof, and a second terminal thereof are connected to the scanning line 5, the signal line 6, and a pixel electrode 8, respectively. Incidentally, although the first terminal and second terminal of the TFT 7 will be explained in a manner of being distinguished from each other, there exists no difference on the function between them.

A liquid-crystal layer 9 is sandwiched between the pixel electrode 8 and an opposed electrode 10. The opposed electrode 10 is maintained at a predetermined electric potential by a not-illustrated opposed-electrode driving circuit. Incidentally, here, although the explanation will be given regarding a liquid-crystal display device based on common longitudinal electric-field scheme, the present invention is an invention relating to the scanning-line driving circuit. As a result, the present invention is applicable to all of matrix-type display devices which display an image by scanning the scanning lines, such as a transverse electric-field scheme liquid-crystal display device and an organic EL (electroluminescence) display device.

In the present embodiment, the signal-line driving circuit 2, which is an individual integrated circuit using single-crystal silicon or the like, is connected directly or via a flexible substrate or the like to a terminal portion provided on the glass substrate.

Meanwhile, the scanning-line driving circuit 13 includes a basic scanning-signal generating circuit 3 and a scanning-line selecting circuit 11. As is the case with the signal-line driving circuit 2, the basic scanning-signal generating circuit 3, which is an individual integrated circuit using single-crystal silicon or the like, is connected directly or via a flexible substrate or the like to a terminal portion provided on the glass substrate.

Also, the scanning-line selecting circuit 11, which is configured using plural MOS transistors having a structure similar to that of the TFT 7, is formed on the glass substrate simultaneously with the display unit 1. A scanning-line selecting circuit driving signal 12 is outputted from the basic scanning-signal generating circuit 3 to the scanning-line selecting circuit 11.

In the case of the present embodiment, semiconductor layers of the MOS transistors configuring the TFT 7 and the scanning-line selecting circuit 11 are composed of amorphous-silicon (a-Si). The present invention, however, is applicable to components such as these MOS transistors and an organic TFT having problems similar to those of the present invention.

EMBODIMENT 2

Figure 2:
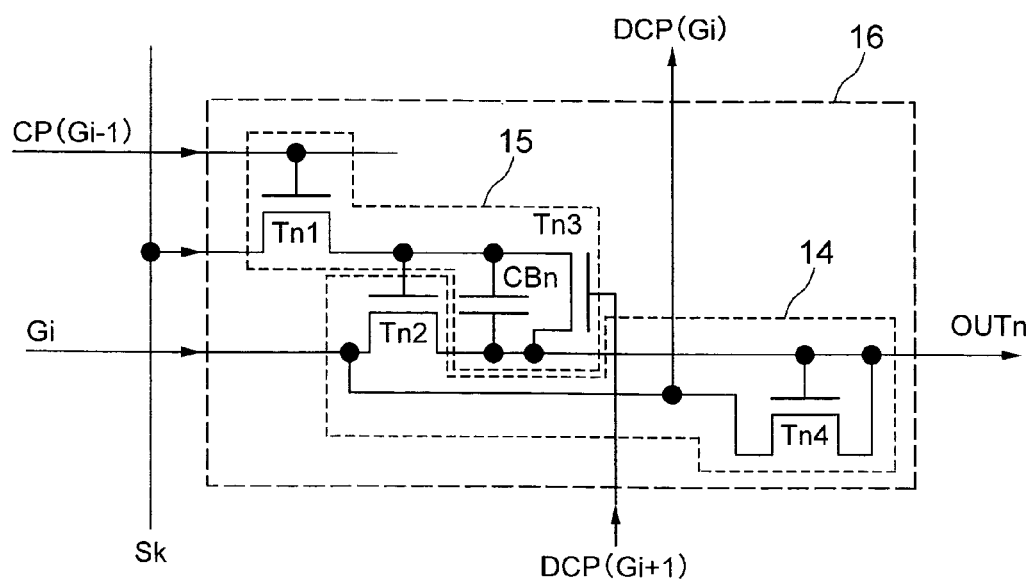
FIG. 2 is a circuit diagram for illustrating an embodiment of a basic circuit in a scanning-line selecting circuit according to the present invention.

FIG. 2 is a circuit diagram for illustrating a basic circuit 16 corresponding to an n-th scanning line in the scanning-line selecting circuit 11 illustrated in FIG. 1. This basic circuit 16, which exists in a one-to-one correspondence relationship with one scanning line, includes a basic scanning-line driving circuit 14 and a voltage raising circuit 15.

The basic scanning-line driving circuit 14 includes a scanning-line driving element Tn2 and a scanning-line stabilizing element Tn4. Also, the voltage raising circuit 15 includes a charge element Tn1, a voltage-raising capacitor CBn, and a discharge element Tn3. These respective elements are MOS transistors formed simultaneously with the TFTs on the display unit 1 and having a structure similar thereto.

A first terminal of the charge element Tn1 or a selecting-signal input terminal is connected to a corresponding selecting-signal line Sk. A gate terminal thereof or a charge-pulse input terminal is connected to a charge-pulse line CP (Gi−1). A second terminal thereof is connected to a gate terminal of the scanning-line driving element Tn2, a first terminal of the voltage-raising capacitor CBn, and a first terminal of the discharge element Tn3.

A first terminal of the scanning-line driving element Tn2 or a basic scanning-signal input terminal is connected to a corresponding basic selecting-signal line Gi and a first terminal of the scanning-line stabilizing element Tn4. A second terminal thereof or an output terminal is connected to a second terminal of the voltage-raising capacitor CBn, a second terminal of the discharge element Tn3, and a gate terminal and a second terminal of the scanning-line stabilizing element Tn4, and also configures the output terminal OUTn. This output terminal OUTn becomes the n-th scanning line. A gate terminal of the discharge element Tn3 or a discharge-pulse input terminal is connected to a discharge-pulse line DCP (Gi+1).

Figure 3:
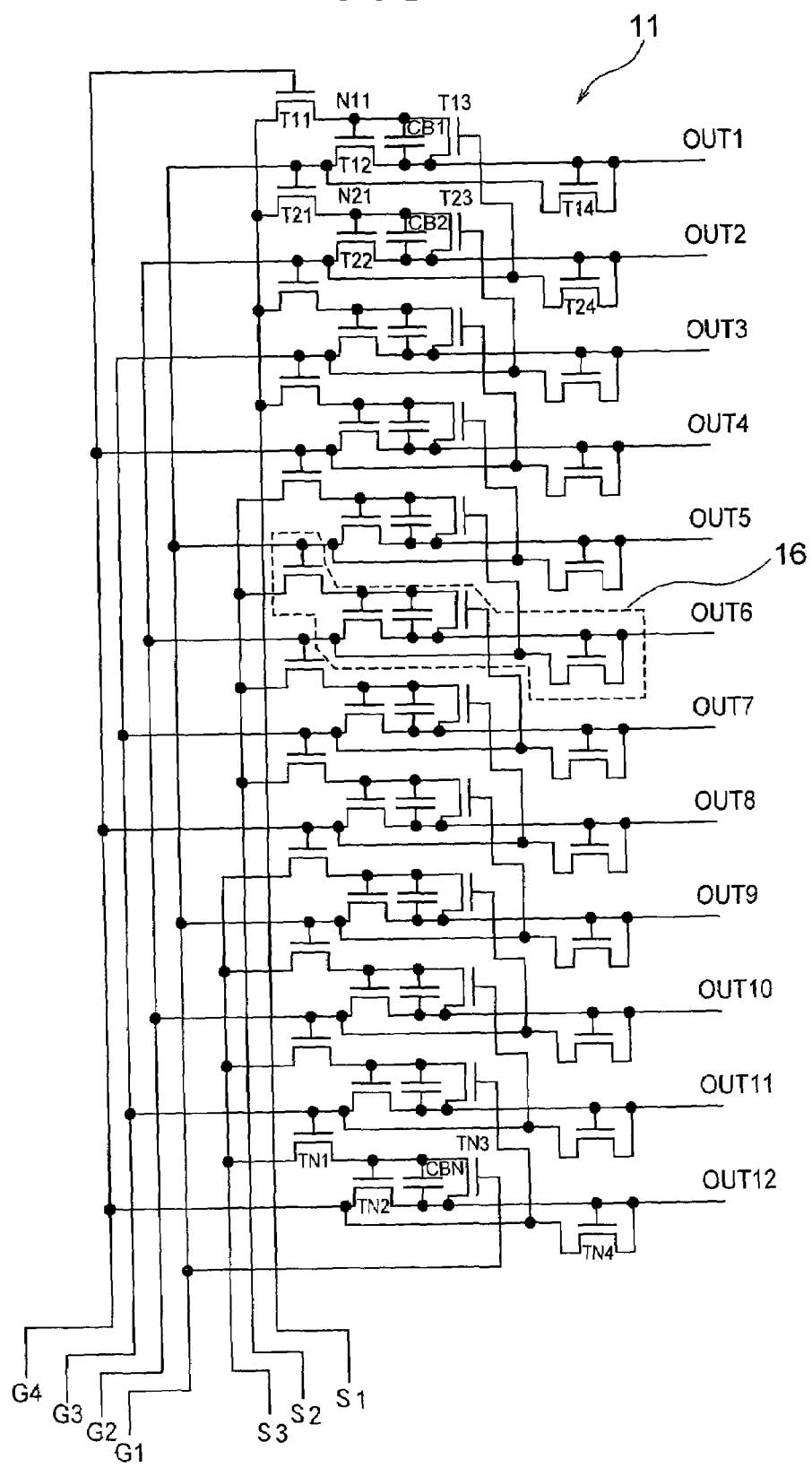
FIG. 3 is a circuit diagram for illustrating an embodiment of the scanning-line selecting circuit.

FIG. 3 is a circuit diagram for illustrating an embodiment of the scanning-line selecting circuit 11 illustrated in FIG. 1. This scanning-line selecting circuit 11 is formed by connecting the basic circuits 16 illustrated in FIG. 2 by the number of the scanning lines.

Figure 4:
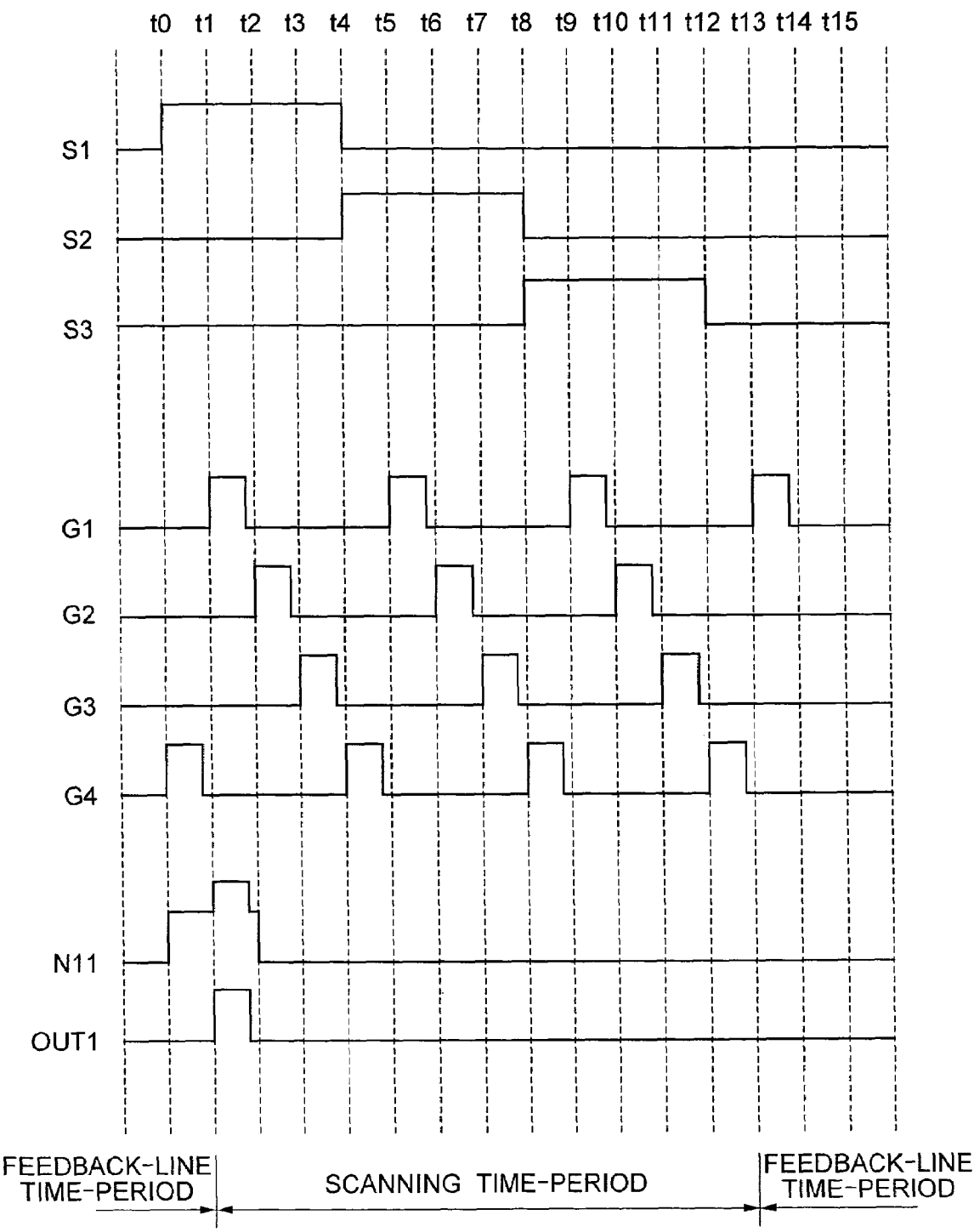
FIG. 4 is a diagram for illustrating a timing chart for FIG. 3.

FIG. 4 illustrates a timing chart for the scanning-line selecting circuit 11. This chart illustrates waveform of a node N11 and that of an output OUT1 with respect to selecting signals S1 to S3 and basic scanning signals G1 to G4 illustrated in FIG. 3. A signal resulting from integrating these selecting signals S1 to S3 and basic scanning signals G1 to G4 is equivalent to the scanning-line selecting circuit driving signal 12.

In the example in FIG. 3, 12 scanning lines are divided into 3 blocks on each 4-line basis. This results in the situation of the 4 basic scanning-signal lines G1 to G4 and 3 selecting-signal lines S1 to S3.

In the present embodiment, although the scanning-line number is set as being 12 for simplicity of the explanation, this number is of course arbitrarily settable in correspondence with necessary scanning-line number. In the case where the scanning-line number is equal to, e.g., 320, the following combinations can be considered: A combination where the basic scanning-signal lines are 80 in number and the selecting-signal lines are 4 in number, a combination where the basic scanning-signal lines are 160 in number and the selecting-signal lines are 2 in number, and the like.

As illustrated in FIG. 3, a first terminal of a MOS transistor T11 or a charge element is connected to the selecting-signal line S1. A gate terminal thereof is connected to the basic scanning-signal line G4. A second terminal thereof or the node N11 is connected to a gate terminal of a MOS transistor T12 or a scanning-line driving element, a first terminal of a capacitor CB1 or a voltage-raising capacitor, and a first terminal of a MOS transistor T13 or a discharge element.

A first terminal of the MOS transistor T12 is connected to the basic scanning-signal line G1, a first terminal of a MOS transistor T14 or a scanning-line stabilizing element, and a gate terminal of a MOS transistor T21 existing at the next stage. A second terminal thereof is connected to a second terminal of the capacitor CB1, a second terminal of the MOS transistor T13, and a gate terminal and a second terminal of the MOS transistor T14, and also configures a first output terminal OUT1.

A gate terminal of the MOS transistor T13 is connected to the basic scanning-signal line G2 existing at the next stage. Hereinafter, basically the same connections will be repeated, thereby forming the scanning-line selecting circuit 11 illustrated in FIG. 1.

Next, referring to the timing chart illustrated in FIG. 4, the explanation will be given below concerning operation of the scanning-line selecting circuit 11 configured as explained above. In the following explanation, the explanation will be given on the assumption that the respective MOS transistors are of n-type. Even if, however, MOS transistors of p-type are used, the employment of a configuration similar to the present invention makes it possible to perform the circuit design.

Also, in the following explanation, reference notations denote the following, respectively: Vth: threshold-value voltage of each MOS transistor, H level or Vφ: highest voltage of each signal (: S1 to S3, G1 to G4), and L level or VSS: lowest voltage of each signal.

At a time t0 illustrated in FIG. 4, the selecting signal S1 and the basic scanning signal G4 are changed into H level. Namely, the basic scanning signal G4 is changed into H level, which switches the MOS transistor T11 ON. As a result, voltage VN11 of the node N11 becomes equal to Vφ−Vth. If the MOS transistor T12 has been designed such that Vφ−Vth>Vth will be satisfied, the MOS transistor T12 is also switched into an ON state.

Between the time t0 and a time t1 next thereto, the basic scanning signal G4 is changed into L level, which switches the MOS transistor T11 OFF. On account of this, the node N11 is brought into a floating state.

At the next time t1, the basic scanning signal G1 is changed into H level. The ON state into which the MOS transistor T12 had been switched is maintained by the capacitor CB1. As a result, the basic scanning signal G1 inputted from the first terminal of the MOS transistor T12 is transmitted to the second terminal thereof.

At this time, on account of the bootstrap effect, the electric potential VN11 of the node N11 maintained in the floating state is substantially represented by the following expression (1):

$$VN11=(V\phi-Vth)+V\phi(CB/(CB+CS)) \quad (1)$$

Here, CB denotes capacity of the capacitor CB1, and CS denotes capacity of a parasitic capacitor. An example of the parasitic capacitor is, e.g., capacity existing between the gate terminal and second terminal of the MOS transistor T11.

By taking the parasitic capacity CS into consideration, capacity value of the capacity CB is set beforehand as being a value which allows coverage of the voltage lowering by Vth. This setting prevents electric potential of the output OUT1 from lowering than Vφ. In this way, the voltage-raising effect on the gate terminal electric-potential of the MOS transistor T12 makes the electric potential of the output OUT1 equal to Vφ. Accordingly, there occurs none of the voltage lowering for the inputted signals. Incidentally, the gate terminal and second terminal of the MOS transistor T14 are connected to the output terminal OUT1. However, since the first terminal connected to the basic scanning-signal line G1 is at H level, it is possible to substantially neglect existence of this MOS transistor T14.

Between the time t1 and a time t2 next thereto, the basic scanning signal G1 is changed into L level. As a result, the output OUT1 is also changed into L level via the MOS transistor T12 maintained in the ON state. Also, at this time, the first terminal of the MOS transistor T14 connected to the basic scanning-signal line G1 is also changed into L level.

On account of this, if, hereinafter, the electric potential of the output OUT1 is going to rise because of a factor of some sort, the current will flow via the MOS transistor T14 as long as the first terminal of the MOS transistor T14 remains at L level. This condition prevents the rise in the electric potential of the OUT1, thereby making a contribution to the stabilization.

In the case of the present embodiment, duty of the basic scanning signals G1 to G4 is equal to 1/4. Consequently, the time during which the first terminal of the MOS transistor T14 is maintained at L level is equivalent to substantially 3/4th of the scanning time-period. However, in the case where the number of the basic scanning-signal lines G1 to G4 is much larger, e.g., in the case of 80 in number, the duty is equal to 1/80 and accordingly the time L level becomes equal to 79/80th.

Also, this scanning-line stabilizing element is additionally provided for stabilization of the scanning line. Consequently, this element can be omitted when the scanning line is sufficiently stable even if there exists none of this element.

At the time t2, the basic scanning signal G2 is changed from L level to H level. Since this basic scanning signal G2 is connected to the gate terminal of the MOS transistor T13, the MOS transistor T13 is switched ON. If the MOS transistor T13 has been switched ON, electric charge in the capacitor CB1 is discharged to the output terminal OUT1 which has been changed into L level. On account of this, the electric potential of the floating node N11 is changed into substantially VSS level. As a result, the MOS transistor T12 is switched into an OFF state, and hereinafter, is maintained in the OFF state.

The discharge operation by the MOS transistor T13, i.e., the discharge element, allows the gate terminal of the MOS transistor T12, i.e., the scanning-line driving element, to be maintained at L level except for a necessary time-period. This makes it possible to avoid unnecessary DC stress.

At a time t4 when the basic scanning signal G4 is changed into H level next, the MOS transistor T11 is switched into an ON state. At this time, however, the selecting signal S1 has been changed into L level. Consequently, the capacitor CB1 will not be charged, and thus the MOS transistor T12 is maintained in the OFF state.

The MOS transistor T12 is maintained in the OFF state. As a result, at a time t5 next thereto, even if the basic scanning-signal line G1 connected to the first terminal of the MOS transistor T12 is changed into H level, this H level is not transmitted to the second terminal. This condition permits the output terminal OUT1 to remain at L level. Hereinafter, the scanning will develop in a manner of repeating basically the same operations.

Here, referring to FIG. 4, the explanation will be given below regarding the DC stress imposed on each MOS transistor. Here, assume that the total scanning-line number is equal to N (=12), and that the basic scanning-signal line number is equal to I (=4). DC-stress time for the charge element Tn1 and the discharge element Tn3 illustrated in FIG. 3 is equal to each ON time-period of the basic scanning signals G1 to G4, and accordingly becomes equal to 1/I. DC-stress time for the scanning-line driving element Tn2 is equal to the high-level time-period of the node Nn1, and accordingly becomes equal to 2/N. Basically, no DC stress is imposed on the scanning-line stabilizing element Tn4. Usually, value of N is about several hundreds to several thousands, and value of I is one-several tenths of N. Consequently, the DC stress imposed on each MOS transistor becomes equal to several tens to several hundreds. This value makes it possible to prevent the threshold-value shift.

EMBODIMENT 3

Figure 5:
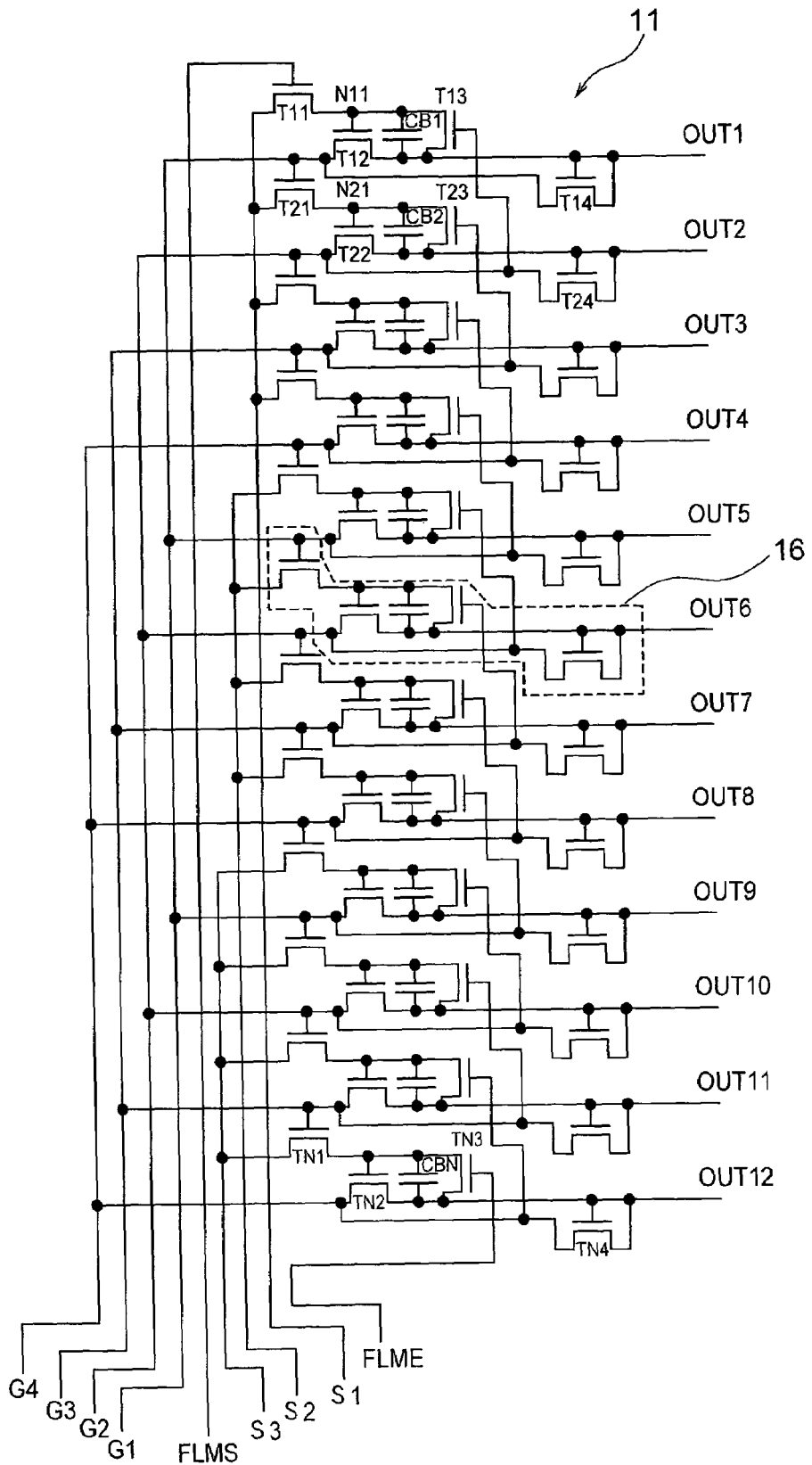
FIG. 5 is a circuit diagram of another embodiment of the scanning-line selecting circuit.

FIG. 5 is a circuit diagram for illustrating another embodiment of the scanning-line selecting circuit 11 illustrated in FIG. 1. In FIG. 5, a gate terminal of a MOS transistor T11 existing at the first stage and a gate terminal of a MOS transistor TN3 existing at the final stage are connected to an auxiliary-signal line FLMS and an auxiliary-signal line FLME, respectively.

Figure 6:
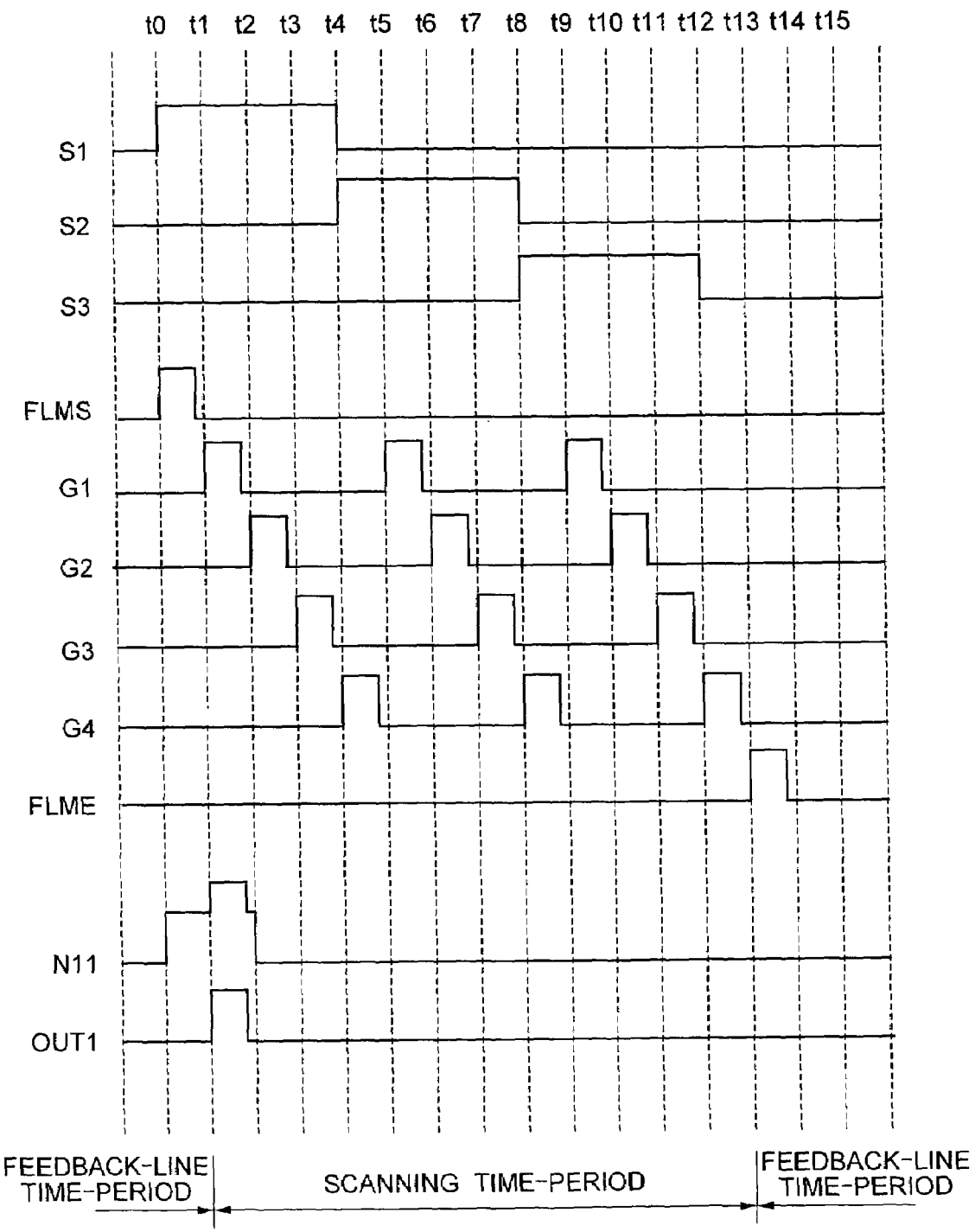
FIG. 6 is a diagram for illustrating a timing chart for FIG. 5.

Also, FIG. 6 illustrates a timing chart for the scanning-line selecting circuit 11 illustrated in FIG. 5. This chart illustrates waveform of a node N11 and that of an output OUT1 with respect to selecting signals S1 to S3, basic scanning signals G1 to G4, and the auxiliary signals FLMS and FLME.

As illustrated in FIG. 5, at first, a first terminal of the MOS transistor T11 is connected to the selecting signal S1. A gate terminal thereof is connected to the auxiliary signal FLMS. A second terminal thereof or the node N11 is connected to a gate terminal of a MOS transistor T12, a first terminal of a capacitor CB1, and a first terminal of a MOS transistor T13.

A first terminal of the MOS transistor T12 is connected to the basic scanning signal G1, a first terminal of a MOS transistor T14, and a gate terminal of a MOS transistor T21 existing at the next stage. A second terminal thereof is connected to a second terminal of the capacitor CB1, a second terminal of the MOS transistor T13, and a gate terminal and a second terminal of the MOS transistor T14, and also configures a first output terminal OUT1. A gate terminal of the MOS transistor T13 is connected to the basic scanning-signal line G2 existing at the next stage.

Next, referring to the timing chart illustrated in FIG. 6, the explanation will be given below concerning operation of the scanning-line selecting circuit 11 illustrated in FIG. 5 and configured in this way.

At a time t0 illustrated in FIG. 6, the selecting signal S1 and the auxiliary signal FLMS are changed into H level. Namely, the auxiliary signal FLMS is changed into H level, which switches the MOS transistor T11 ON. As a result, voltage VN11 of the node N11 becomes equal to Vφ–Vth. If the MOS transistor T12 has been designed such that Vφ–Vth>Vth will be satisfied, the MOS transistor T12 is also switched into an ON state.

Between the time t0 and a time t1 next thereto, the auxiliary signal FLMS is changed into L level, which switches the MOS transistor T11 OFF. On account of this, the node N11 is brought into a floating state. Until a time t13, operations hereinafter are the same as those illustrated in FIG. 4.

At the time t13 when driving of the final scanning line has been completed, the auxiliary signal FLME is changed into H level, which switches the MOS transistor TN3 ON. Namely, the MOS transistor TN3 is switched ON. This discharges a capacitor CBN, and also maintains a MOS transistor TN2 at an OFF state. In this way, the operations during one scanning time-period are terminated.

EMBODIMENT 4

Figure 7:
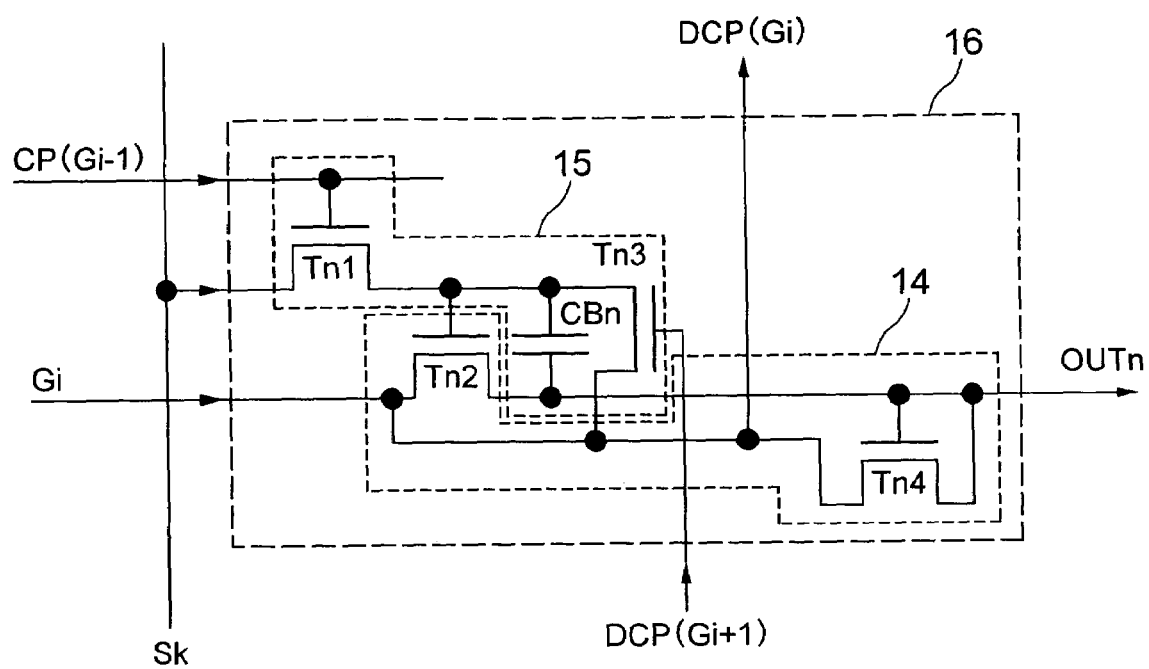
FIG. 7 is a circuit diagram for illustrating another embodiment of the basic circuit in the scanning-line selecting circuit according to the present invention.
Figure 8:
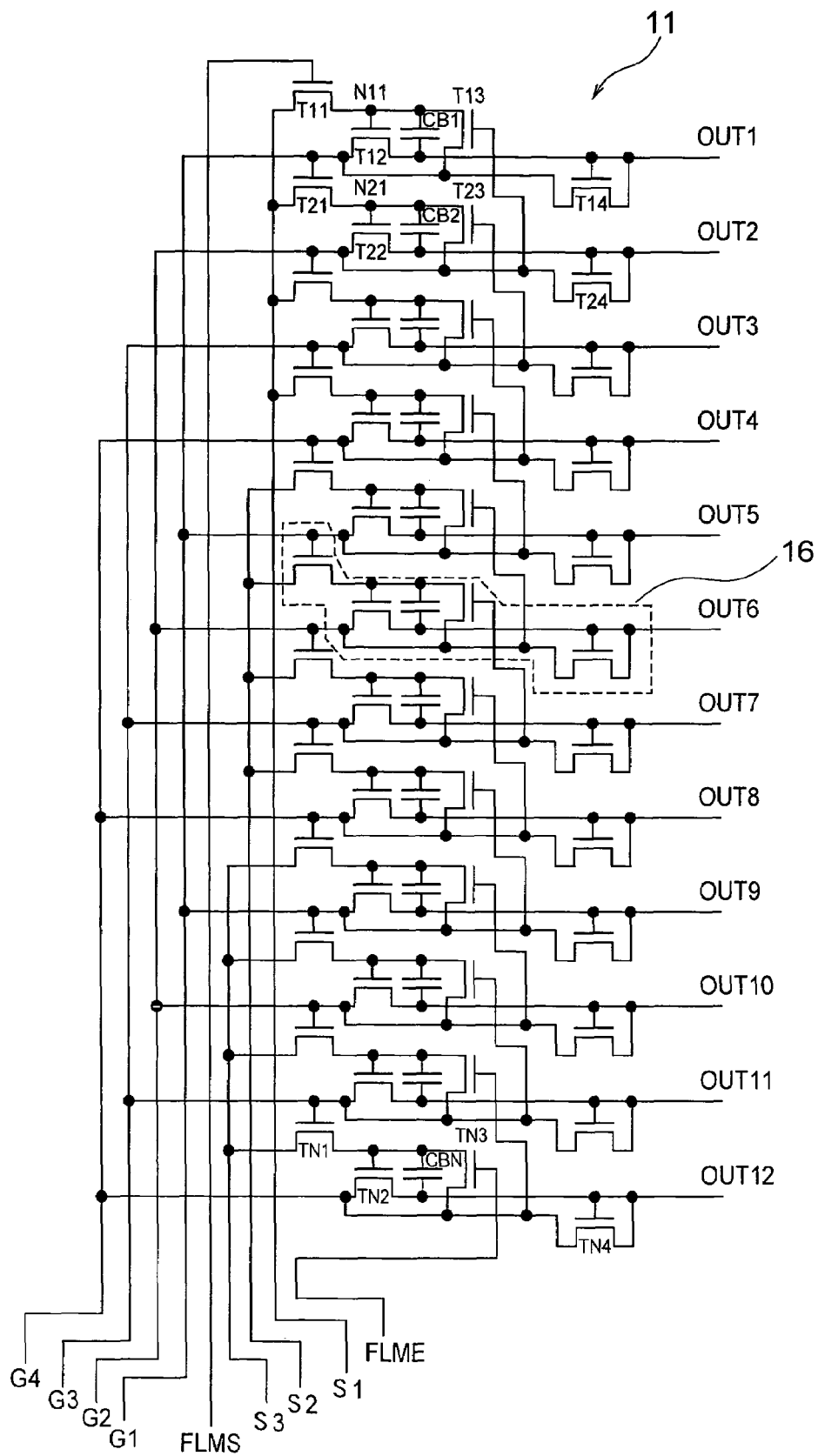
FIG. 8 is a circuit diagram for illustrating another embodiment of the scanning-line selecting circuit.

FIG. 7 is a circuit diagram for illustrating another embodiment of the basic circuit in the present embodiment. What differs from the basic circuit illustrated in FIG. 2 is as follows: Namely, although, in FIG. 2, the second terminal of the MOS transistor TN3 is connected to the second terminal of the MOS transistor TN2, the second terminal of the MOS transistor TN3 is connected to the first terminal of the MOS transistor TN2. FIG. 8 illustrates a scanning-line selecting circuit 11 resulting from connecting these basic circuits over plural stages.

In FIG. 8, what differs from the scanning-line selecting circuit 11 illustrated in FIG. 3 is merely as follows: Namely, the second terminal of the MOS transistor T13 which becomes the discharge element is connected to the first terminal of the scanning-line driving element T12. Simultaneously, the discharge destination from the voltage-raising capacitor CB1 becomes the basic scanning-signal line G1 which has been changed into L level. The timing chart therefore is the same as the one illustrated in FIG. 6.

EMBODIMENT 5

Figure 9:
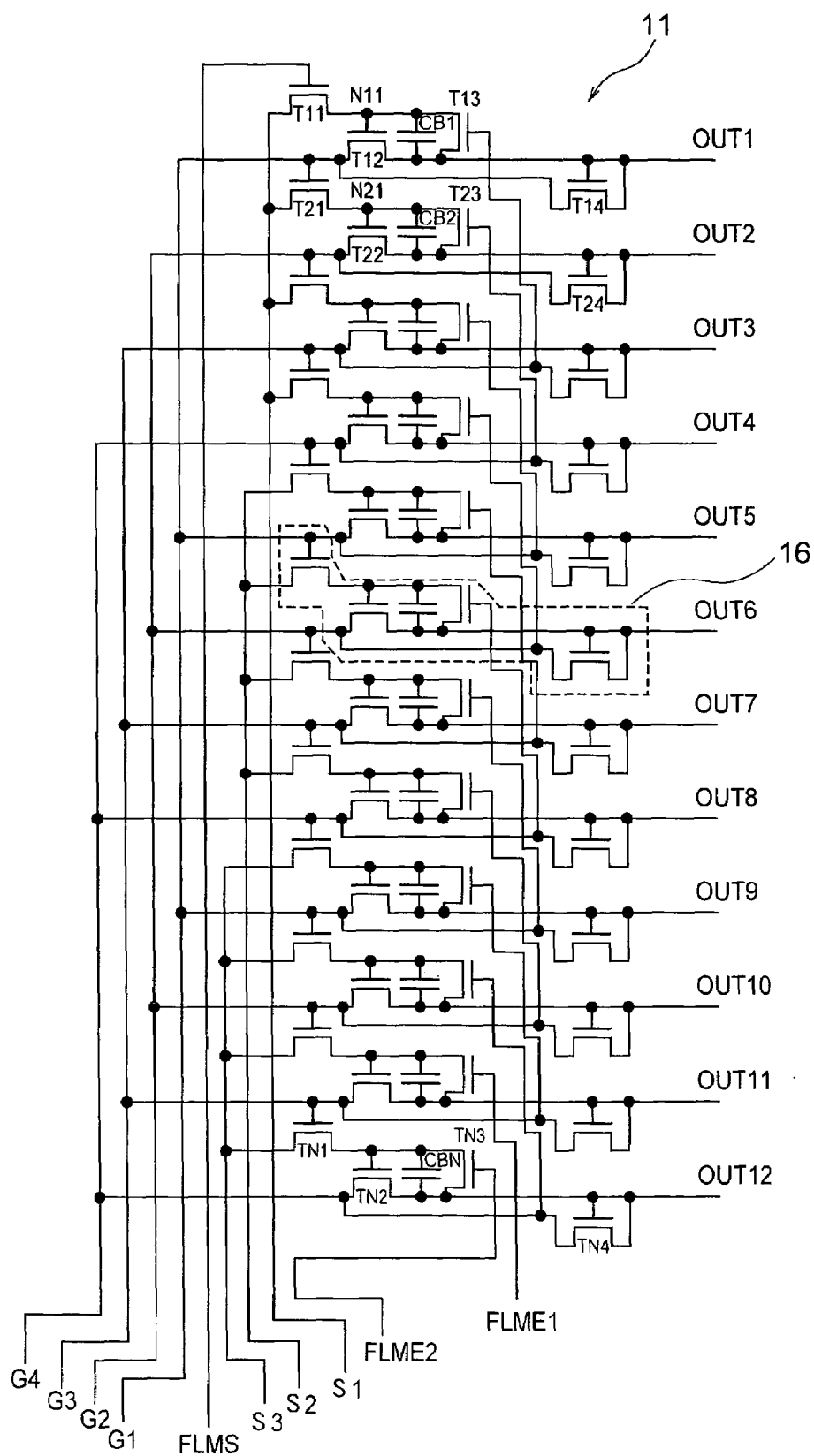
FIG. 9 is a circuit diagram for illustrating another embodiment of the scanning-line selecting circuit.
Figure 10:
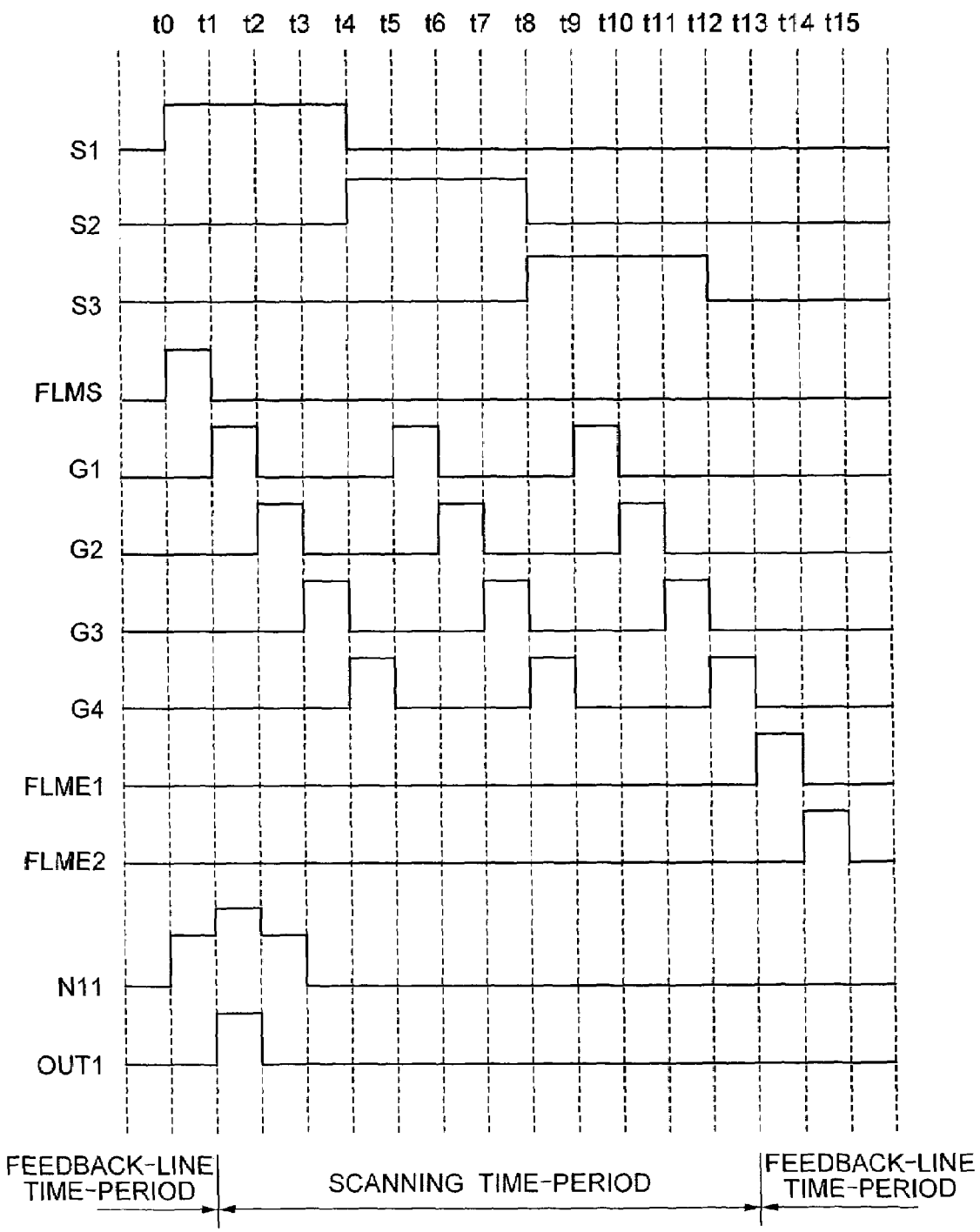
FIG. 10 is a diagram for illustrating a timing chart for FIG. 9.

FIG. 9 is a circuit diagram for illustrating another embodiment of the scanning-line selecting circuit 11 illustrated in FIG. 1. FIG. 10 illustrates a timing chart therefore.

In the embodiments explained so far, the gate terminal of the MOS transistor Tn3 or the discharge element has been connected to the basic scanning-signal line Gn+1 existing at the next stage. This condition has required that a slight amount of time lag be provided between falling edge of the n-th basic scanning signal and rising edge of the (n+1)-th basic scanning signal.

As illustrated in FIG. 9, the gate terminal of the MOS transistor Tn3 or the discharge element is connected to a basic scanning-signal line Gn+2 existing at the second next stage. This condition, as illustrated in FIG. 10, makes it possible to enlarge a time-period of each of the basic scanning signals G1 to G4 of substantially one horizontal scanning time-period.

In FIG. 9, a first terminal of a MOS transistor T11 is connected to the selecting signal S1. A gate terminal thereof is connected to an auxiliary signal FLMS. A second terminal thereof or the node N11 is connected to a gate terminal of a MOS transistor T12, a first terminal of a capacitor CB1, and a first terminal of a MOS transistor T13.

A first terminal of the MOS transistor T12 is connected to the basic scanning-signal line G1, a first terminal of a MOS transistor T14, and a gate terminal of a MOS transistor T21 existing at the next stage. A second terminal thereof is connected to a second terminal of the capacitor CB1, a second terminal of the MOS transistor T13, and a gate terminal and a second terminal of the MOS transistor T14, and also configures a first output terminal OUT1.

A gate terminal of the MOS transistor T13 is connected to the basic scanning-signal line G3 existing at the second next stage. Hereinafter, basically the same connections will be repeated. Eventually, a gate terminal of a MOS transistor Tn3 existing at an 11th stage and a gate terminal of a MOS transistor TN3 existing at the final stage are connected to an auxiliary signal FLME1 and an auxiliary signal FLME2, respectively.

Next, referring to the timing chart in FIG. 10, the explanation will be given below regarding operation of the scanning-line selecting circuit 11 configured as explained above. At a time t0 illustrated in FIG. 10, the selecting signal S1 and the auxiliary signal FLMS are changed into H level. Namely, the auxiliary signal FLMS is changed into H level, which switches the MOS transistor T11 ON. As a result, voltage VN11 of the node N11 becomes equal to Vφ–Vth. If the MOS transistor T12 has been designed such that Vφ–Vth>Vth will be satisfied, the MOS transistor T12 is also switched into an ON state.

At a time t1 next thereto, the auxiliary signal FLMS is changed from H level into L level, and the basic scanning signal G1 is changed from L level into H level. Namely, the auxiliary signal FLMS is changed into L level. This switches the MOS transistor T11 OFF, thereby bringing the node N11 into a floating state.

At this time, the ON state into which the MOS transistor T12 had been switched is maintained by the capacitor CB1. As a result, the basic scanning signal G1 inputted from the first terminal of the MOS transistor T12 is transmitted to the second terminal thereof. At this time, on account of the bootstrap effect, the electric potential VN11 of the node N11 maintained in the floating state is raised up to VN11=(Vφ−Vth)+Vφ(CB/(CB+CS)).

Also, the gate terminal and second terminal of the MOS transistor T14 are connected to the output terminal OUT1. However, the first terminal is connected to the basic scanning signal G1, and at this time, the basic scanning signal G1 is at H level. Consequently, it is possible to substantially neglect existence of this MOS transistor T14.

At a time t2 next thereto, the basic scanning signal G1 is changed into L level, and thus the output OUT1 is also changed into L level. Also, at this time, the first terminal of the MOS transistor T14 connected to the basic scanning signal G1 is also changed into L level.

On account of this, if, hereinafter, the electric potential of the output OUT1 is going to rise because of a factor of some sort, the current will flow via the MOS transistor T14 as long as the first terminal of the MOS transistor T14 remains at L level. This condition prevents the rise in the electric potential of the OUT1, thereby making a contribution to the stabilization.

At a time t3 next thereto, the basic scanning signal G3 is changed from L level to H level. Since this basic scanning signal G3 is connected to the gate terminal of the MOS transistor T13, the MOS transistor T13 is switched ON.

If the MOS transistor T13 has been switched ON, electric charge in the capacitor CB1 is discharged to the output terminal OUT1 which has been changed into L level. On account of this, the electric potential of the floating node N11 is changed into substantially VSS level. As a result, the MOS transistor T12 is switched into an OFF state, and hereinafter, is maintained in the OFF state. Hereinafter, the scanning will be performed in a manner of repeating basically the same operations.

At a time t13, the auxiliary signal FLME1, which is connected to the gate terminal of the discharge element Tn3 in a basic circuit corresponding to an 11th scanning line, is changed from L level to H level, thereby discharging a capacitor CBn.

At a time t14 next thereto, the auxiliary signal FLME2, which is connected to the gate terminal of the discharge element TN3 in a basic circuit corresponding to a 12th scanning line, is changed from L level to H level, thereby discharging a capacitor CBN. Hereinafter, basically the same operations will be repeated.

Figure 11:
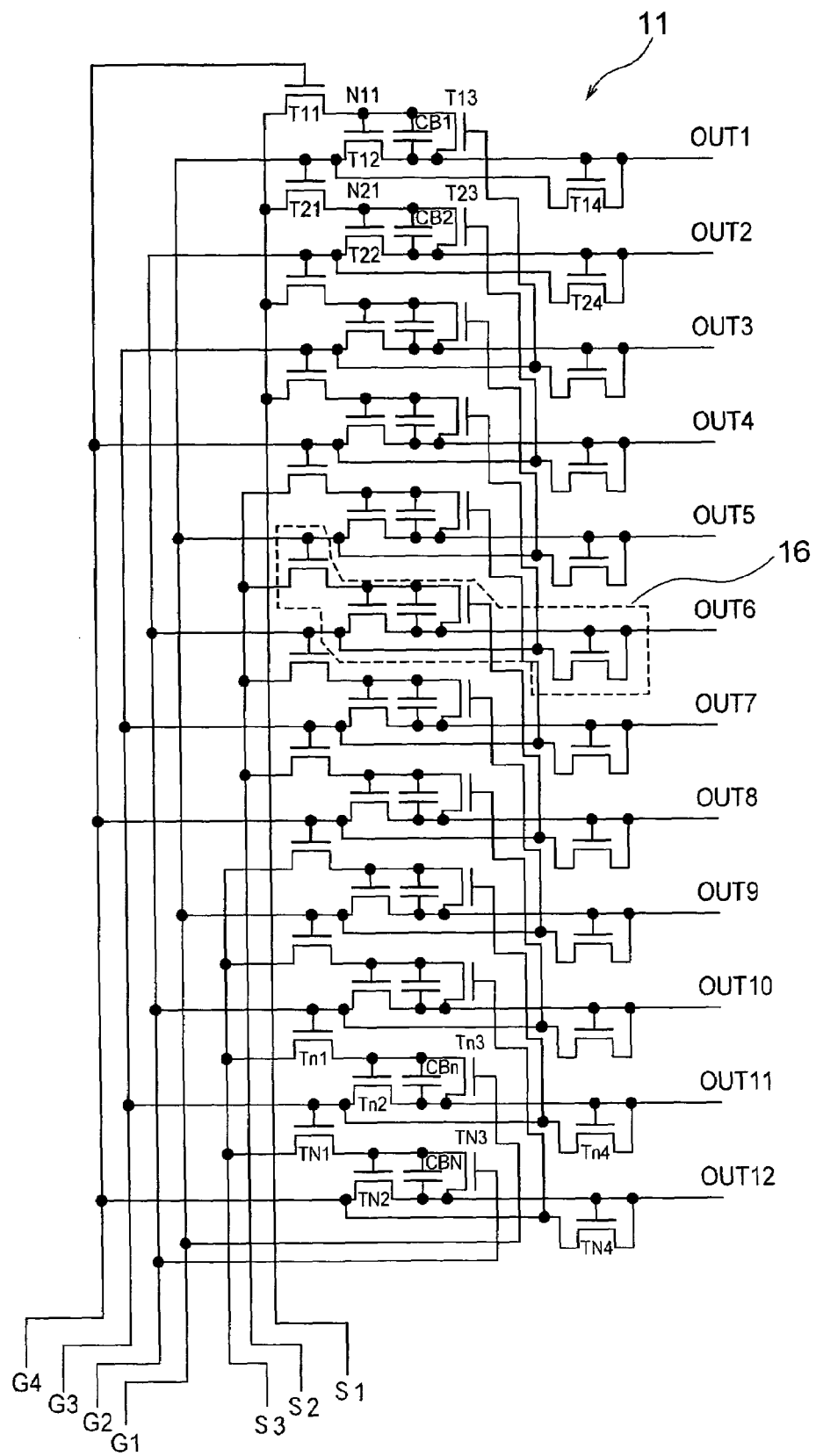
FIG. 11 is a circuit diagram for illustrating another embodiment of the scanning-line selecting circuit.
Figure 12:
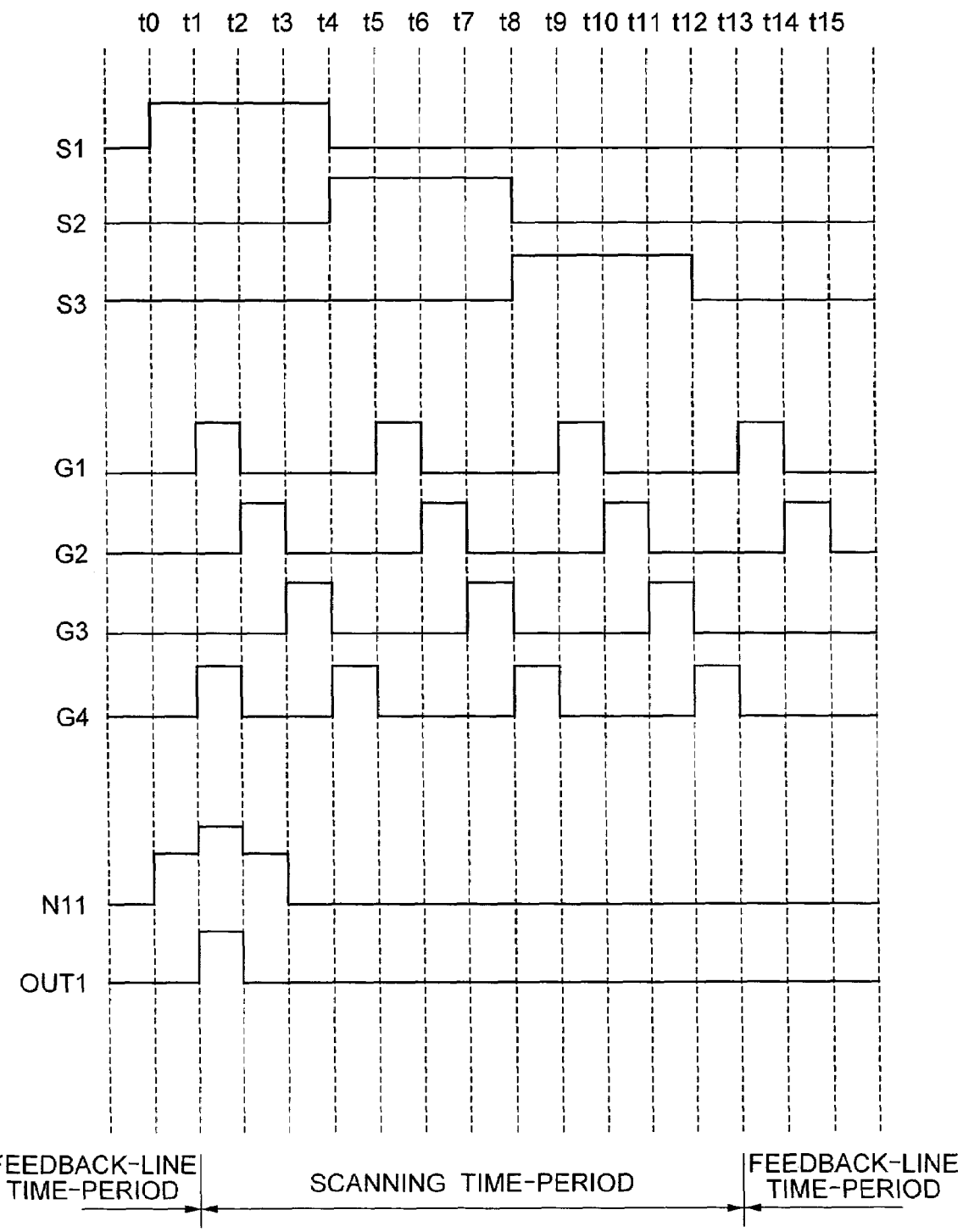
FIG. 12 is a diagram for illustrating a timing chart for FIG. 11.

Although, in the present embodiment, the explanation has been given above concerning the case of using the auxiliary signals, this is of course also applicable to the case of using none of the auxiliary signals. In that case, the basic scanning signal G4 is used as the auxiliary signal FLMS, and the basic scanning signals G1 and G2 are used as the auxiliary signals FLME1 and FLME2. FIG. 11 illustrates a circuit diagram in that case, and FIG. 12 illustrates a timing chart therefore.

EMBODIMENT 6

Figure 13:
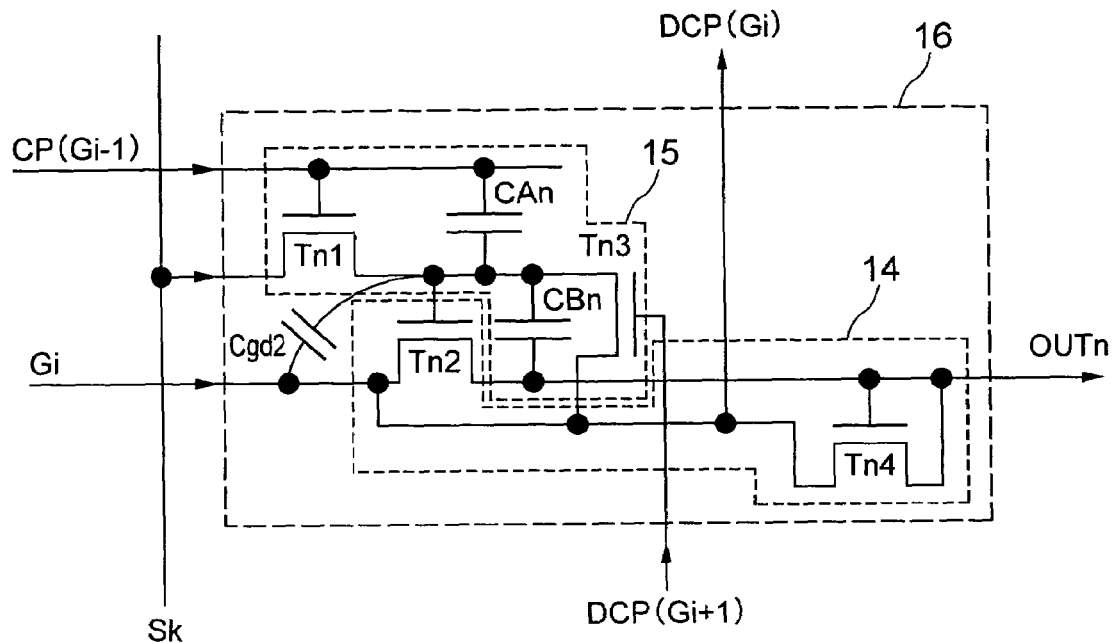
FIG. 13 is a circuit diagram for illustrating another embodiment of the basic circuit in the scanning-line selecting circuit according to the present invention.

FIG. 13 is a circuit diagram for illustrating another embodiment of the basic circuit 16 illustrated in FIG. 2. This basic circuit 16, which exists in a one-to-one correspondence relationship with one scanning line, includes a basic scanning-line driving circuit 14 and a voltage raising circuit 15.

The basic scanning-line driving circuit 14 includes a scanning-line driving element Tn2 and a scanning-line stabilizing element Tn4. Also, the voltage raising circuit 15 includes a charge element Tn1, a voltage-raising capacitor CBn, a stabilizing capacitor CAn, and a discharge element Tn3. These respective elements are MOS transistors formed simultaneously with the TFTs on the display unit and having a structure similar thereto.

A first terminal of the charge element Tn1 is connected to a corresponding selecting-signal line Sk. A gate terminal thereof is connected to a charge-pulse line CP and a first terminal of the stabilizing capacitor CAn. A second terminal thereof is connected to a gate terminal of the scanning-line driving element Tn2, a first terminal of the voltage-raising capacitor CBn, a second terminal of the stabilizing capacitor CAn, and a first terminal of the discharge element Tn3.

A first terminal of the scanning-line driving element Tn2 is connected to a corresponding basic selecting-signal line Gi, a second terminal of the discharge element Tn3, and a first terminal of the scanning-line stabilizing element Tn4. A second terminal thereof is connected to a second terminal of the voltage-raising capacitor CBn, and a gate terminal and a second terminal of the scanning-line stabilizing element Tn4, and also configures an output terminal OUTn.

A gate terminal of the discharge element Tn3 is connected to a discharge-pulse line DCP. The output terminal OUTn, which becomes an n-th scanning line, is connected to a gate terminal of each n-th TFT on a scanning line 5 on the display unit 1. Here, note that a parasitic capacitor (Cgd2) exists between the gate terminal and first terminal of the MOS transistor Tn2.

In a non-selection time-period (Sk=L level), when the basic selecting signal Gi has been changed from L level into H level, there exists a danger that, depending on capacity value of the parasitic capacitor (Cgd2), capacitive coupling may raise electric potential of the gate terminal of the scanning-line driving element Tn2 maintained in the floating state. At this time, the electric potential of the node N11 is substantially represented by the following expression (2):

$$VN11 = VSS + V\phi(Cgd2/(Cgd2+CS)) \quad (2)$$

Here, CS denotes a parasitic capacitor. An example of the parasitic capacitor is, e.g., capacity existing between the gate terminal and second terminal of the MOS transistor Tn1.

Depending on capacity ratio between the parasitic capacitors Cgd2 and CS in the expression (2), there occurs a phenomenon that the OFF state of the scanning-line driving element Tn2 becomes somewhat weaker, and that the electric potential of the second terminal of the scanning-line driving element Tn2 is somewhat raised as compared with L level.

In order to reduce this rise, the stabilizing capacitor CAn is inserted in series with the parasitic capacitor Cgd2. Based on the following two functional operations, the stabilizing capacitor CAn makes a contribution to stabilization of the gate-terminal electric potential of the scanning-line driving element Tn2.

Namely, in the case where the corresponding selecting signal Sk=L level, 1. when the charge pulse CP is changed from H level into L level, the stabilizing capacitor CAn, based on capacitive coupling, performs a functional operation of pushing down the gate electric potential of the scanning-line driving element Tn2.

2. the stabilizing capacitor CAn, which corresponds to CS in the expression (2), increases the value of CS, thereby preventing the electric-potential rise in the node N11. In the expression (1) as well, however, the stabilizing capacitor CAn functions as the parasitic capacitor CS, thereby lowering the voltage-raising effect. Accordingly, the design needs to be performed while paying attention to the value.

EMBODIMENT 7

Figure 14:
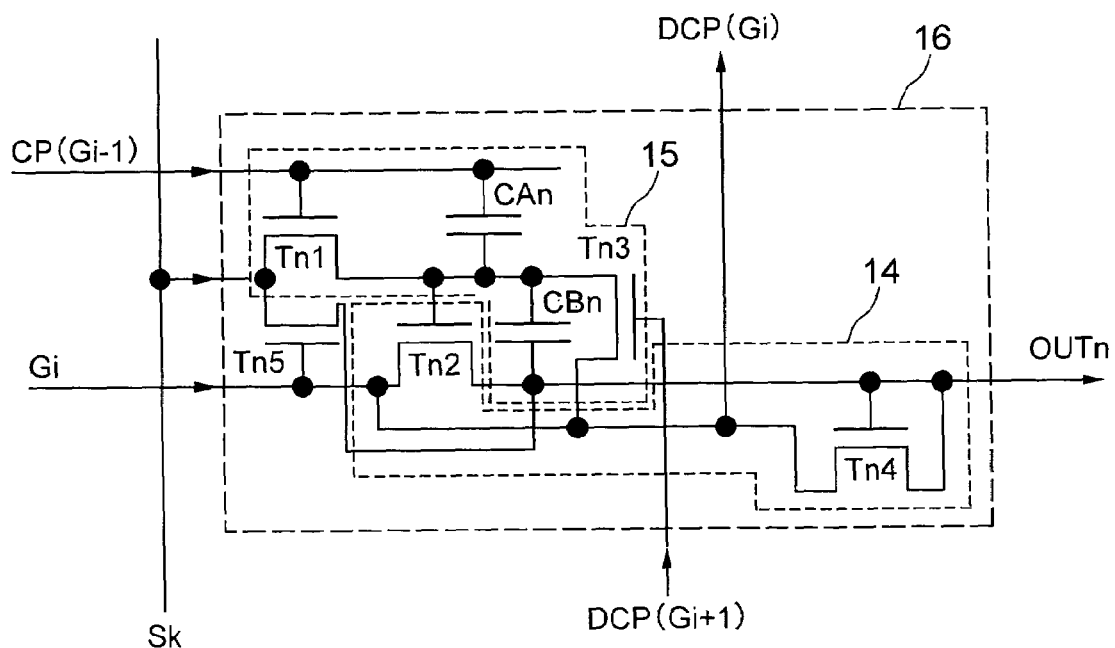
FIG. 14 is a circuit diagram for illustrating another embodiment of the basic circuit in the scanning-line selecting circuit according to the present invention.

FIG. 14 is a circuit diagram for illustrating another embodiment of the basic circuit 16 corresponding to the n-th scanning line in the scanning-line selecting circuit 11 illustrated in FIG. 1. This basic circuit 16, which exists in a one-to-one correspondence relationship with one scanning line, includes a basic scanning-line driving circuit 14, a voltage raising circuit 15, and a second scanning-line stabilizing element Tn5. The basic scanning-line driving circuit 14 includes a scanning-line driving element Tn2 and a scanning-line stabilizing element Tn4. Also, the voltage raising circuit 15 includes a charge element Tn1, a voltage-raising capacitor CBn, a stabilizing capacitor CAn, and a discharge element Tn3.

A first terminal of the charge element Tn1 is connected to a corresponding selecting-signal line Sk and a first terminal of the second scanning-line stabilizing element Tn5. A gate terminal thereof is connected to a charge-pulse line CP and a first terminal of the stabilizing capacitor CAn. A second terminal thereof is connected to a gate terminal of the scanning-line driving element Tn2, a first terminal of the voltage-raising capacitor CBn, a second terminal of the stabilizing capacitor CAn, and a first terminal of the discharge element Tn3.

A first terminal of the scanning-line driving element Tn2 is connected to a corresponding basic selecting-signal line Gi, a second terminal of the discharge element Tn3, a first terminal of the scanning-line stabilizing element Tn4, and a gate terminal of the second scanning-line stabilizing element Tn5. A second terminal thereof is connected to a second terminal of the voltage-raising capacitor CBn, a gate terminal and a second terminal of the scanning-line stabilizing element Tn4, and a second terminal of the second scanning-line stabilizing element Tn5, and also configures an output terminal OUTn. The output terminal OUTn becomes the n-th scanning line. A gate terminal of the discharge element Tn3 is connected to a discharge-pulse line DCP.

Figure 15:
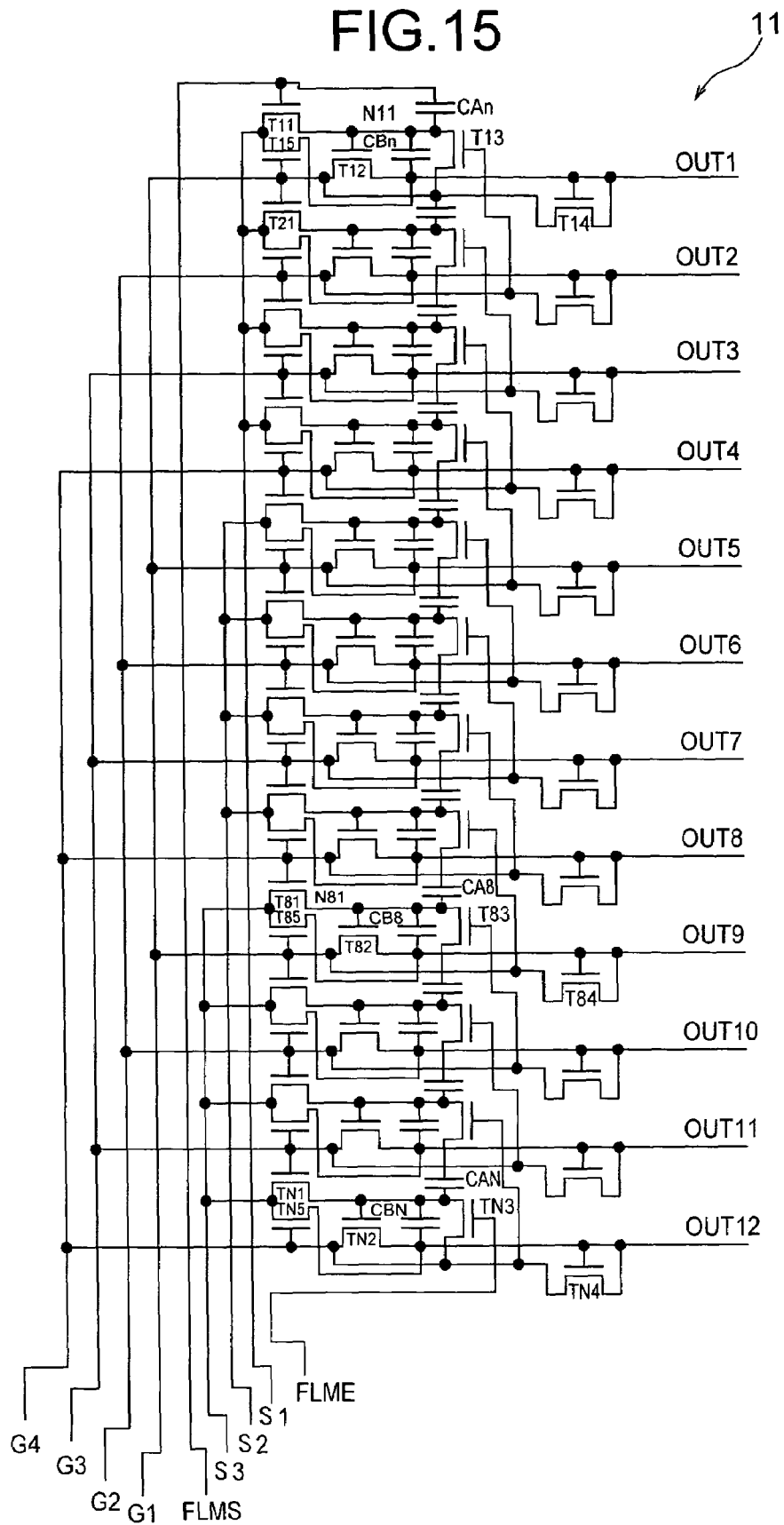
FIG. 15 is a circuit diagram for illustrating another embodiment of the scanning-line selecting circuit.
Figure 16:
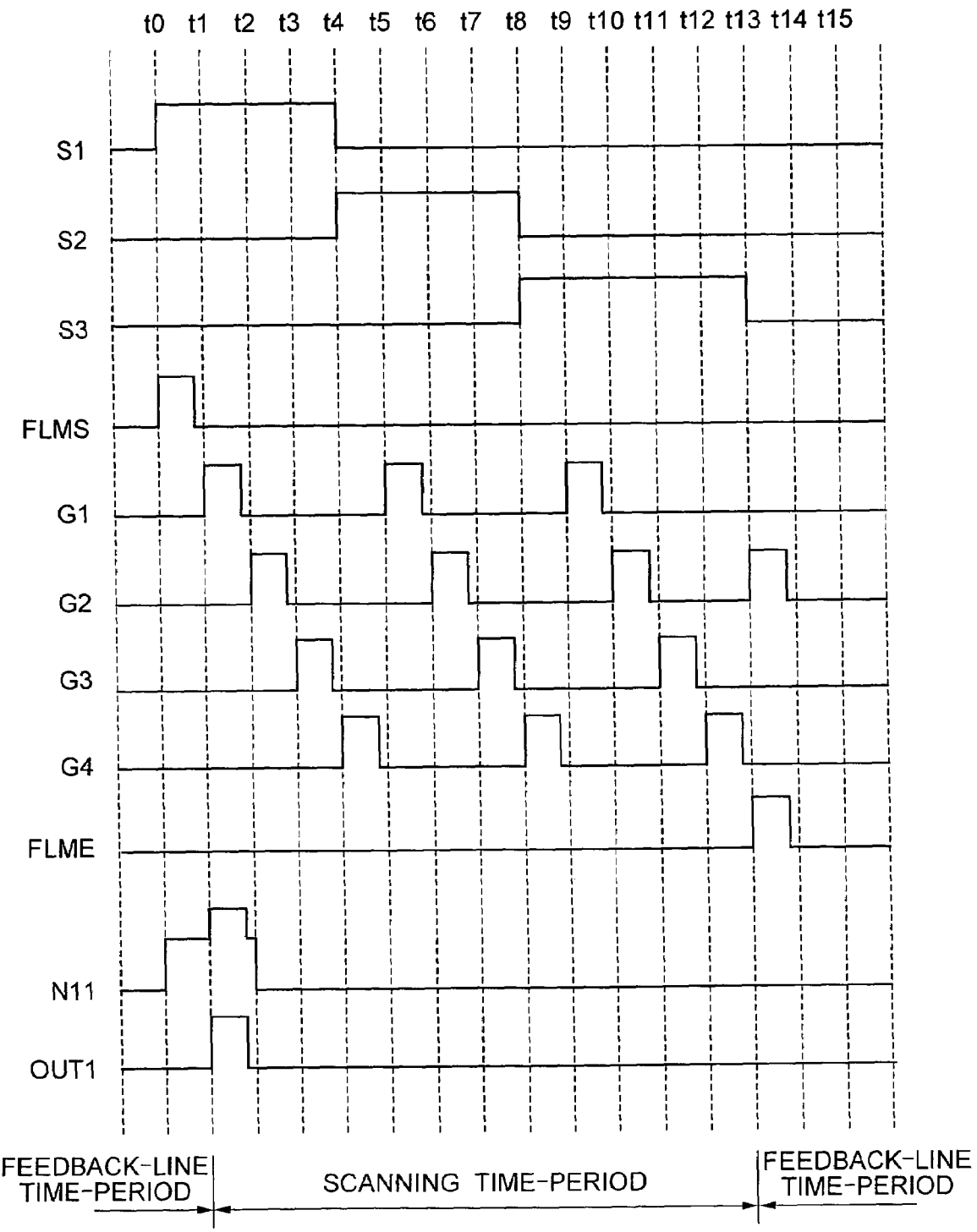
FIG. 16 is a diagram for illustrating a timing chart for FIG. 15.

FIG. 15 is a circuit diagram for illustrating an embodiment of the scanning-line selecting circuit 11 formed by connecting the basic circuits 16 illustrated in FIG. 14 over the plural stages corresponding to the number of the scanning lines. Also, FIG. 16 illustrates a timing chart therefore. This chart illustrates waveform of a node N11 and that of an output OUT1 with respect to selecting signals S1 to S3 and basic scanning signals G1 to G4.

As illustrated in FIG. 15, a first terminal of a MOS transistor T11 or a charge element is connected to the selecting-signal line S1 and a first terminal of the MOS transistor T15 or the second scanning-line stabilizing element. A gate terminal thereof is connected to an auxiliary-signal line FLMS and the first terminal of the stabilizing capacitor CAn. A second terminal thereof or the node N11 is connected to a gate terminal of a MOS transistor T12 or a scanning-line driving element, a first terminal of a voltage-raising capacitor CB1, the second terminal of the stabilizing capacitor CAn, and a first terminal of a MOS transistor T13 or a discharge element.

A first terminal of the MOS transistor T12 is connected to the basic scanning-signal line G1, a first terminal of a MOS transistor T14 or a scanning-line stabilizing element, the gate terminal of the MOS transistor T15, a gate terminal of a MOS transistor T21 existing at the next stage, and a second terminal of the MOS transistor T13 or the discharge element. A second terminal thereof is connected to a second terminal of the voltage-raising capacitor CB1, a gate terminal and a second terminal of the MOS transistor T14, and the second terminal of the MOS transistor T15, and also configures a first output terminal OUT1. A gate terminal of the MOS transistor T13 is connected to the basic scanning-signal line G2. Hereinafter, basically the same connections will be repeated, thereby forming the scanning-line selecting circuit 11.

Next, referring to the timing chart in FIG. 16, the explanation will be given below regarding operation of the scanning-line selecting circuit 11 configured as illustrated in FIG. 15. At a time t0 illustrated in FIG. 16, the selecting signal S1 and the auxiliary signal FLMS are changed into H level. Namely, the auxiliary signal FLMS is changed into H level, which switches the MOS transistor T11 ON. As a result, voltage VN11 of the node N11 becomes equal to Vφ−Vth. If the MOS transistor T12 has been designed such that Vφ−Vth>Vth will be satisfied, the MOS transistor T12 is also switched into an ON state.

Between the time t0 and a time t1 next thereto, the auxiliary signal FLMS is changed into L level, which switches the MOS transistor T11 OFF. On account of this, the node N11 is brought into a floating state.

At the next time t1, the basic scanning signal G1 is changed into H level. The ON state into which the MOS transistor T12 had been switched is maintained by the capacitor CB1. As a result, the basic scanning signal G1 inputted from the first terminal of the MOS transistor T12 is transmitted to the second terminal thereof. At this time, on account of the bootstrap effect by the capacitor CB1, there occurs none of the voltage lowering for the inputted signals.

Also, this basic scanning signal G1 is also connected to the gate terminal of the MOS transistor T15. As a result, at the time t1, the MOS transistor T15 is also switched into an ON state. At this time, since the selecting signal S1 connected to the first terminal of the MOS transistor T15 is at H level, this MOS transistor T15 operates such that the voltage of the output terminal OUT1 will be changed into H level. Incidentally, the gate terminal and second terminal of the MOS transistor T14 are connected to the output terminal OUT1. However, since the first terminal connected to the basic scanning signal G1 is at H level, it is possible to substantially neglect existence of this MOS transistor T14. Until a time t4, operations hereinafter are the same as those illustrated in FIG. 6.

Next, at the time t4, the selecting signal S1 has been changed into L level. Consequently, the capacitor CB1 will not be charged, and thus the MOS transistor T12 is maintained in the OFF state.

The MOS transistor T12 is maintained in the OFF state. As a result, at a time t5 next thereto, even if the basic scanning-signal line G1 connected to the first terminal of the MOS transistor T12 is changed into H level, this H level is not transmitted to the second terminal. This condition permits the output terminal OUT1 to remain at L level. Simultaneously, at this time, the MOS transistor T15 is switched into an ON state.

The first terminal of the MOS transistor T15 is connected to the selecting signal S1, and the second terminal thereof is connected to the output terminal OUT1. As a consequence, if this MOS transistor T15 has been switched into the ON state, this MOS transistor T15 operates such that the output terminal OUT1 will be connected to the selecting signal S1 at L level. This makes it possible to enhance even further L-level stability of the output terminal OUT1 at the non-selection time. Hereinafter, the scanning will develop in a manner of repeating basically the same operations.

At a time t13 when an auxiliary signal FLME is changed into H level, the basic scanning-signal line G2 is also changed into H level. The reason for this is as follows:

At a time t12, since the basic scanning-signal line G4 is changed into H level, a MOS transistor T81 is switched into an ON state. Simultaneously, at this time, the selecting signal S3 is also at H level. As a consequence, a capacitor CB8 is charged via the MOS transistor T81 at the ON state. This raises electric potential of a node N81. In order to discharge this electric charge charged, the basic scanning signal G2 connected to a gate terminal of a MOS transistor T83 is changed into H level at the time t13. This discharges the electric charge to the basic scanning signal G1 at L level, thereby suppressing the electric potential of the node N81 down to substantially L level.

EMBODIMENT 8

So far, the explanation has been given above concerning the case where the scanning-line driving circuit 13 illustrated in FIG. 1 is located on one side of the display unit 1. In the present embodiment, however, the scanning-line driving circuits 13 are located on both sides of the display unit 1. FIG. 17 illustrates a schematic diagram of the display device in that case. This display device includes the display unit 1, the signal-line driver 2, a scanning-line driving circuit 13A provided on one side of the display unit 1, and a scanning-line driving circuit 13B provided on the other one side of the display unit 1.

The scanning-line driving circuit 13A is configured to drive even-number scanning lines, and the scanning-line driving circuit 13B is configured to drive odd-number scanning lines. Employing the configuration like this makes it possible to enlarge location width in the signal-line direction of a scanning-line selecting circuit 11A and a scanning-line selecting circuit 11B formed on a glass substrate, and also makes it possible to shorten location width in the scanning-line direction thereof.

Also, of the scanning-line selecting circuit driving signal 12 supplied to the scanning-line driving circuit 13 illustrated in FIG. 1, the basic scanning signals can be supplied in a manner of being divided into odd-number scanning-line signals and even-number scanning-line signals. This allows implementation of a display device which is smaller in outer size.

In the configuration in FIG. 17, however, it is required to implement the three chips, i.e., the signal-line driver 2, the one scanning-line driving circuit 13A, and the other scanning-line driving circuit 13B. Consequently, there exists a danger of bringing about a rise in implementation cost and a lowering in yield.

In order to prevent this danger, the employment of a 1-chip driver IC can be considered which results from integrating functions of the signal-line driver 2, one basic scanning-signal generating circuit 3A, and the other basic scanning-signal generating circuit 3B.

FIG. 18 illustrates a schematic diagram of the display device in that case. Here, in substitution for the signal-line driver 2, the one basic scanning-signal generating circuit 3A, and the other basic scanning-signal generating circuit 3B illustrated in FIG. 17, there is provided a 1-chip driver 17 which results from integrating these functions. The other configuration is basically the same as the one illustrated in FIG. 17.

Figure 19:
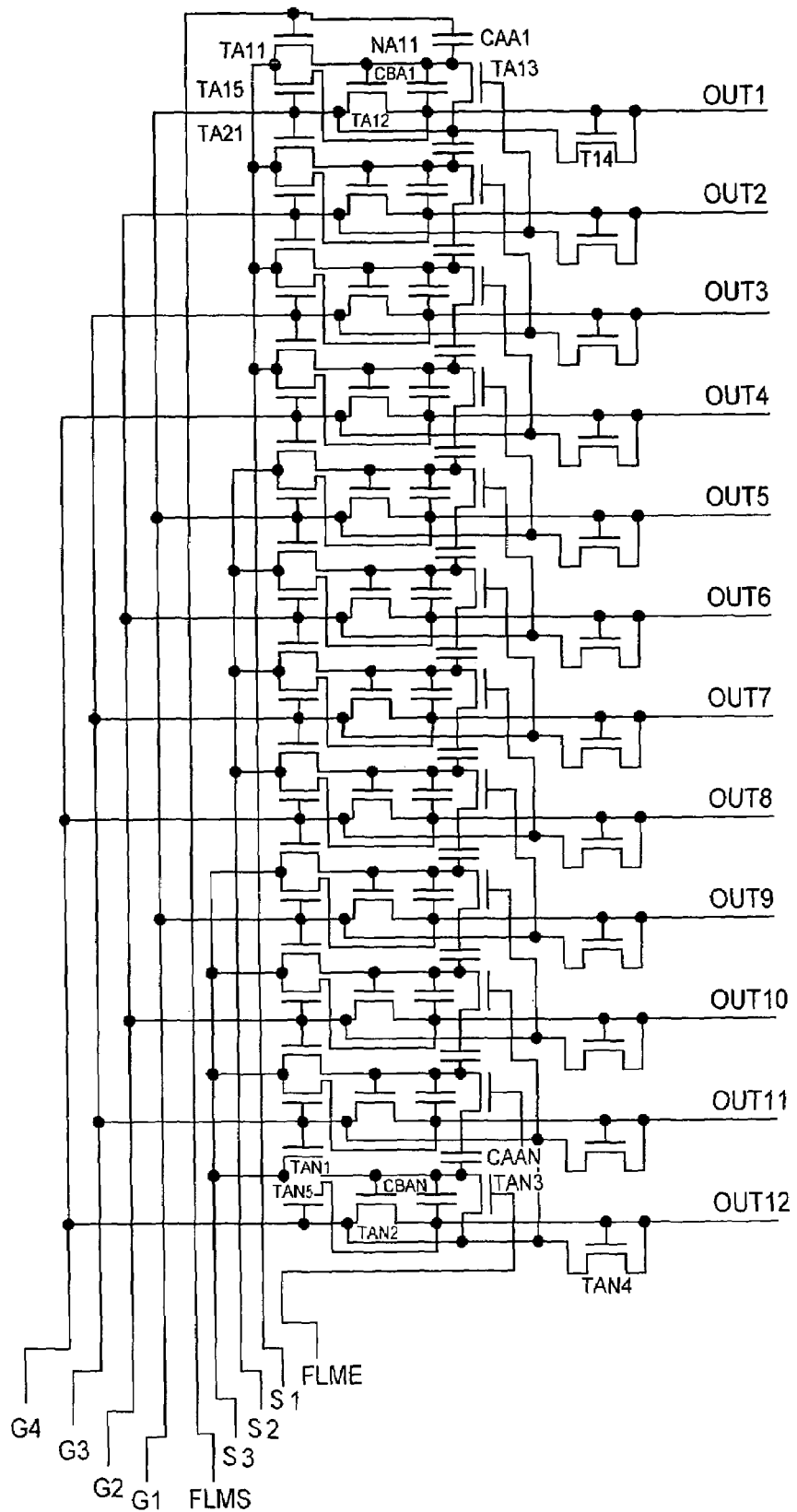
FIG. 19 is a circuit diagram for illustrating another embodiment of the scanning-line selecting circuit.
Figure 20:
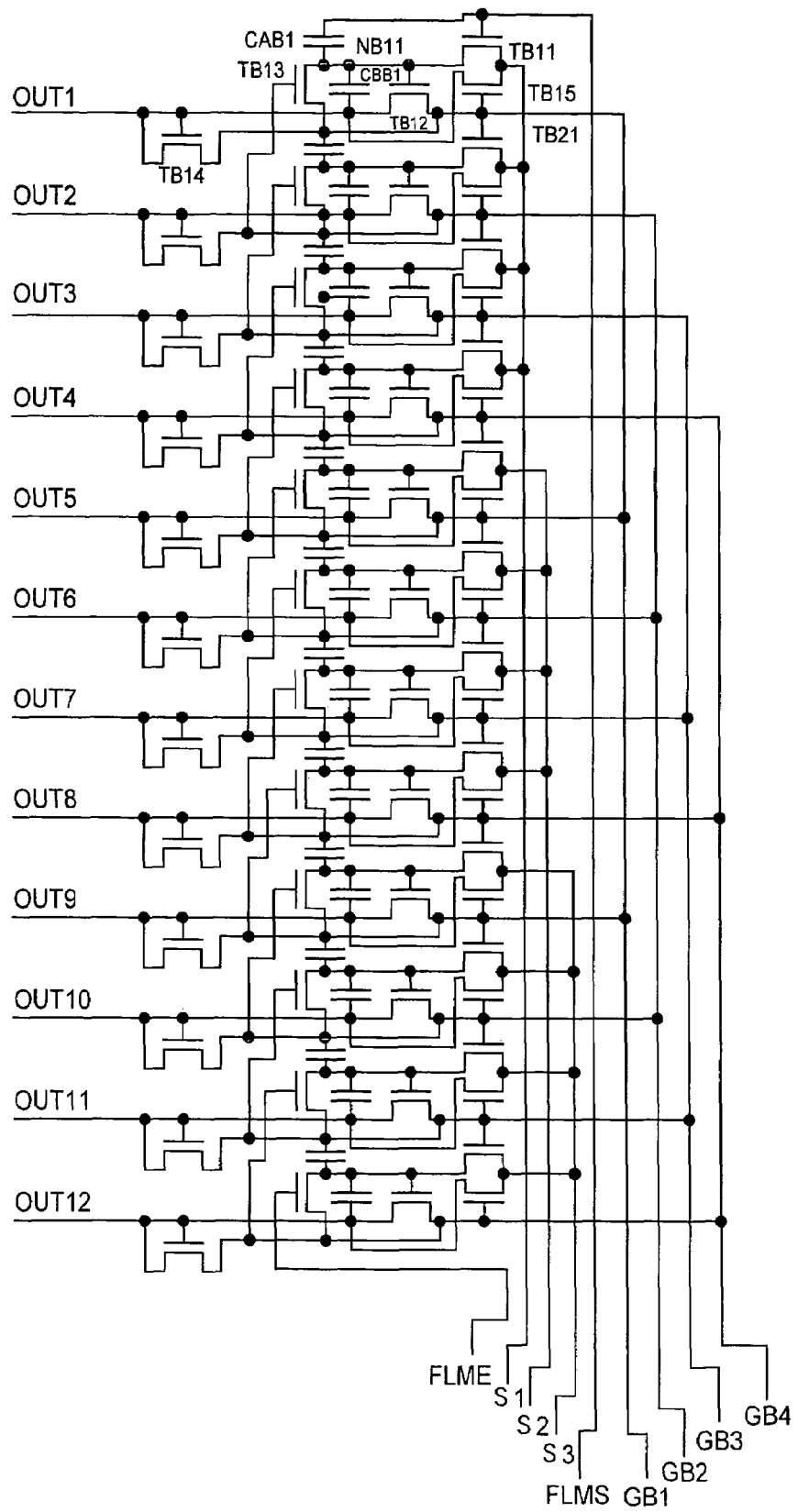
FIG. 20 is a circuit diagram for illustrating another embodiment of the scanning-line selecting circuit.

FIG. 19 is and FIG. 20 illustrate an embodiment of each of the scanning-line selecting circuits 11A and 11B in the display device configured as illustrated in FIG. 17 and FIG. 18.

Figure 21:
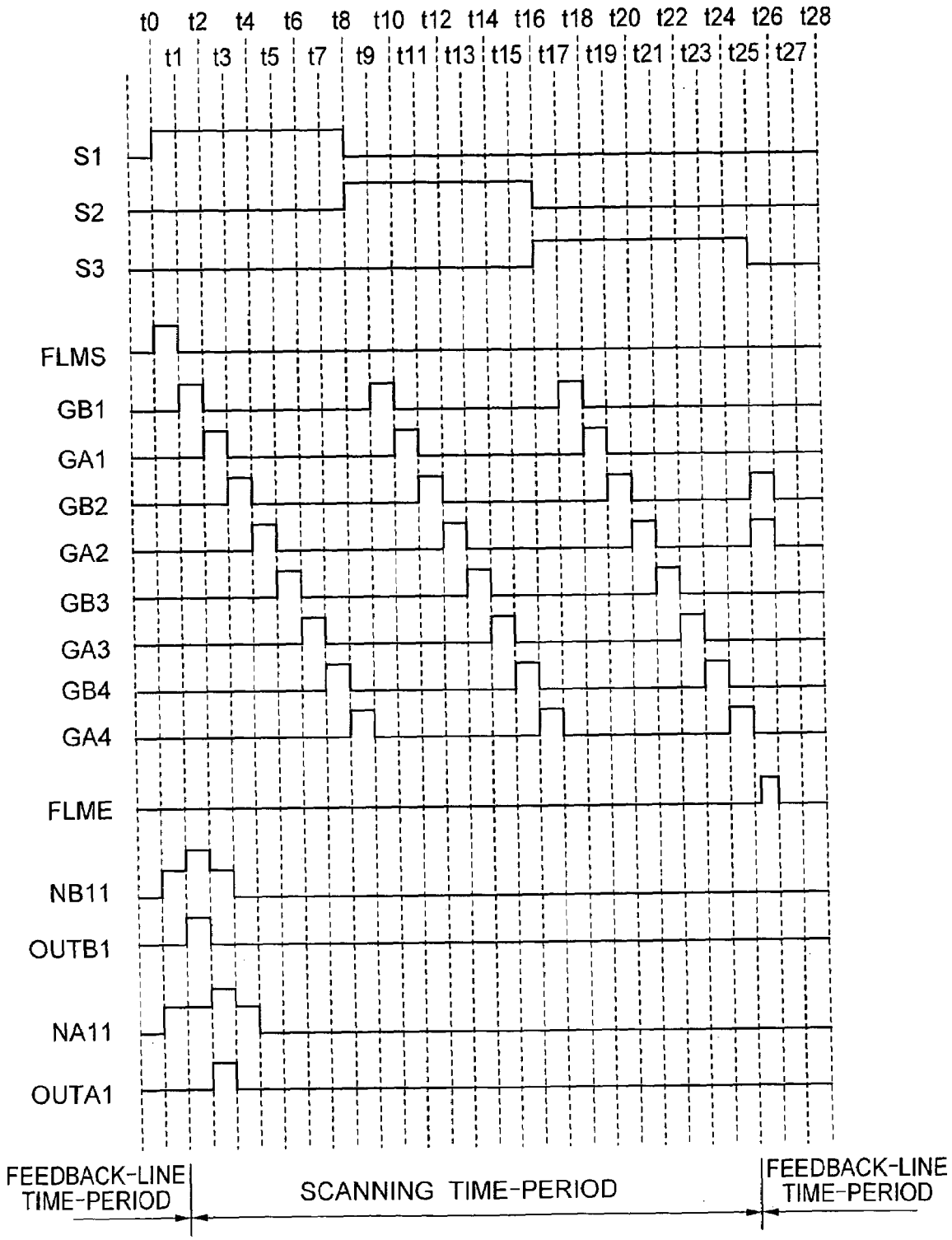
FIG. 21 is a diagram for illustrating a timing chart for FIG. 19 and FIG. 20.

Also, FIG. 21 illustrates a timing chart therefore. In this chart, the number of scanning lines to be driven is equal to 24, i.e., four basic scanning signals GA1 to GA4 to be inputted into the scanning-line selecting circuit 11A, four basic scanning signals GB1 to GB4 to be inputted into the scanning-line selecting circuit 11B, and three selecting signals S1 to S3. The other basic configuration is basically the same as the one illustrated in FIG. 15.

FIG. 19 illustrates a circuit diagram of the scanning-line selecting circuit 11A for driving the even-number-th scanning lines. The selecting signals S1, S2, and S3 and the basic scanning signals GA1 to GA4 corresponding to the even-number-th scanning lines are inputted into the scanning-line selecting circuit 11A. Also, an auxiliary signal FLMS and an auxiliary signal FLME are inputted therein as a charge pulse at the first stage and a discharge pulse at the final stage, respectively. Similarly, FIG. 20 illustrates a circuit diagram of the scanning-line selecting circuit 11B for driving the odd-number-th scanning lines. The selecting signals S1, S2, and S3 and the basic scanning signals GB1 to GB4 corresponding to the odd-number-th scanning lines are inputted into the scanning-line selecting circuit 11B. Also, the auxiliary signal FLMS and the auxiliary signal FLME are inputted therein as the charge pulse at the first stage and the discharge pulse at the final stage, respectively. The connection is established such that outputs OUTA1 and OUTA2 from the scanning-line selecting circuit 11A and outputs OUTB1 and OUTB2 from the scanning-line selecting circuit 11B drive the even-number-th scanning lines and the odd-number-th scanning lines, respectively.

Next, referring to the timing chart in FIG. 21, the explanation will be given below regarding operations of the scanning-line selecting circuit 11A and the scanning-line selecting circuit 11B configured as explained above. This chart illustrates waveforms of the selecting signals S1 to S3, the basic scanning signals GA1 to GA4 and GB1 to GB4, and the auxiliary signals FLMS and FLME, and waveforms of a node NB11 and the output terminal OUTB1 in FIG. 20 and waveforms of a node NA11 and the output terminal OUTA1 in FIG. 19. However, since the basic operation is the same as the ones illustrated in FIG. 15 and FIG. 16, the detailed explanation thereof will be omitted. Accordingly, points characteristic of FIG. 21 will be explained.

At a time t0 illustrated in FIG. 21, the selecting signal S1 and the auxiliary signal FLMS are changed into H level. Namely, the auxiliary signal FLMS is changed into H level, which switches the MOS transistor TB11 ON. As a result, voltage VNB11 of the node NB11 becomes equal to V$\phi$−Vth. If the MOS transistor TB12 has been designed such that V$\phi$−Vth>Vth will be satisfied, the MOS transistor TB12 is also switched into an ON state. Simultaneously, at this time, the MOS transistor TA11 is switched ON. As a result, as is the case with the node NB11, voltage of the node NA11 also becomes equal to V$\phi$−Vth.

At a time t1 next thereto, the auxiliary signal FLMS is changed into L level, and thus the MOS transistor TB11 is switched OFF. On account of this, the node NB11 is brought into a floating state, and also the basic scanning signal GB1 is changed from L level into H level. At this time, because of the bootstrap effect, the voltage of the node NB11 is raised, and thus the output terminal OUTB1 is changed into H level. Simultaneously, the node NA11 is also brought into a floating state. However, since the basic scanning signal GA1 remains at L level, the output terminal OUTA1 also remains at L level.

At a time t2 next thereto, the basic scanning signal GB1 is changed into L level. This changes the output terminal OUTB1 into L level via the MOS transistor TB12 which still remains in the ON state. Simultaneously, the basic scanning signal GA1 is changed into H level. At this time, because of the bootstrap effect, the voltage of the node NA11 is raised, and thus the output terminal OUTA1 is changed into H level.

At a time t3 next thereto, the basic scanning signal GB2, i.e., the discharge pulse at the first stage, is changed into H level. This discharges a capacitor CBB1, thereby changing the node NB11 into L level. Also, the basic scanning signal GA1 is changed into L level. This changes the output terminal OUTA1 into L level via the MOS transistor TB12 which still remains in the ON state.

At a time t4 next thereto, the basic scanning signal GA2 is changed into H level. This discharges a capacitor CBA1, thereby changing the node NA11 into L level.

At a time t25, the basic scanning signal GA4 is changed into L level, and at the same time, the basic scanning signals GB2 and GA2 are changed into H level. As was explained in FIG. 16, this is performed in order to discharge the electric charge which has been unnecessarily charged into the voltage-raising capacitor. After that, between the time t25 and a time t26, the auxiliary signal FLME is changed into H level. Up to this step, the series of operations are terminated. The reason why a slight amount of time gap is provided from the time t25 to the rising edge of FLME is that an output terminal OUTA12 necessitates a time during which the OUTA12 will have been changed into L level. In order to satisfy this condition, this auxiliary signal FLME may also be set such that FLME will rise at, e.g., the time t26.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. The scanning-line selecting circuit comprising basic circuits connected with each other over plural stages,
   wherein each of said basic circuits comprises a basic scanning-line driving circuit and a voltage raising circuit,
   said basic scanning-line driving circuit including a basic scanning-signal input terminal and an output terminal,
   said voltage raising circuit including a selecting-signal input terminal, a charge-pulse input terminal, and a discharge-pulse input terminal,
   said voltage raising circuit driving said basic scanning-line driving circuit,
   wherein, said voltage raising circuit further comprises a charge element, a voltage-raising capacitor, and a discharge element,
   said basic scanning-line driving circuit further comprising a scanning-line driving element,
   a first terminal of said charge element being connected to said selecting-signal input terminal, a gate terminal thereof being connected to said charge-pulse input terminal, a second terminal thereof being connected to a gate terminal of said scanning-line driving element, a first terminal of said voltage-raising capacitor, and a first terminal of said discharge element,
   a first terminal of said basic scanning-line driving element being connected to said basic scanning-signal input terminal, a second terminal thereof being connected to a second terminal of said voltage-raising capacitor and a second terminal of said discharge element and forming said output terminal,
   a gate terminal of said discharge element being connected to said discharge-pulse input terminal.

2. The scanning-line selecting circuit comprising basic circuits connected with each other over plural stages,
   wherein each of said basic circuits comprises a basic scanning-line driving circuit and a voltage raising circuit,
   said basic scanning-line driving circuit including a basic scanning-signal input terminal and an output terminal,
   said voltage raising circuit including a selecting-signal input terminal, a charge-pulse input terminal, and a discharge-pulse input terminal,
   said voltage raising circuit driving said basic scanning-line driving circuit,
   wherein, said voltage raising circuit further comprises a charge element, a voltage-raising capacitor, and a discharge element,
   said basic scanning-line driving circuit further comprising a scanning-line driving element and a scanning-line stabilizing element,
   a first terminal of said charge element being connected to said selecting-signal input terminal, a gate terminal thereof being connected to said charge-pulse input terminal, a second terminal thereof being connected to a gate terminal of said scanning-line driving element, a first terminal of said voltage-raising capacitor, and a first terminal of said discharge element,
   a first terminal of said basic scanning-line driving element being connected to said basic scanning-signal input terminal and a first terminal of said scanning-line stabilizing element, a second terminal thereof being connected to a second terminal of said voltage-raising capacitor, a second terminal of said discharge element, and a gate terminal and a second terminal of said scanning-line stabilizing element and forming said output terminal,
   a gate terminal of said discharge element being connected to said discharge-pulse input terminal.

* * * * *